(12) United States Patent
Wu et al.

(10) Patent No.: US 11,683,903 B2
(45) Date of Patent: Jun. 20, 2023

(54) HOST CASING OF ELECTRONIC DEVICE AND DISASSEMBLY AND ASSEMBLY MODULE FOR DUMMY COVER

(71) Applicant: Wistron Corporation, New Taipei (TW)

(72) Inventors: Long-Hua Wu, New Taipei (TW); Chi-Ken Tsai, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 17/164,893

(22) Filed: Feb. 2, 2021

(65) Prior Publication Data

US 2022/0159863 A1 May 19, 2022

(30) Foreign Application Priority Data

Nov. 16, 2020 (CN) .......................... 202011280209.X

(51) Int. Cl.
*H05K 7/14* (2006.01)
*H05K 5/03* (2006.01)

(52) U.S. Cl.
CPC ............. *H05K 7/1488* (2013.01); *H05K 5/03* (2013.01)

(58) Field of Classification Search
CPC ...................................................... G06F 1/187
See application file for complete search history.

(56) References Cited

U.S. PATENT DOCUMENTS

| 6,695,520 B1 * | 2/2004 | Sarno ................... H05K 7/1409 439/153 |
| 7,124,417 B2 | 10/2006 | Inoue et al. |
| 2015/0146372 A1 * | 5/2015 | French, Jr. ........... H05K 7/1489 29/854 |

FOREIGN PATENT DOCUMENTS

| CN | 1459220 A | 11/2003 |
| TW | I685290 B | 2/2020 |

* cited by examiner

*Primary Examiner* — Jerry Wu
(74) *Attorney, Agent, or Firm* — McClure, Qualey & Rodack, LLP

(57) ABSTRACT

A host casing of an electronic device includes a housing, a filler panel, and a disassembly and assembly structure. A front side of the housing has an opening. The dummy cover is disposed in the opening of the housing. The disassembly and assembly structure is disposed inside the housing. In a first state, the disassembly and assembly structure buckles with the dummy cover, thereby fixing the dummy cover. In a second state, the disassembly and assembly structure releases the dummy cover, and simultaneously pushes the dummy cover out of the opening. Therefore, the replacement action between the dummy cover and a pluggable device can be effectively simplified, so that maintenance personnel can easily assemble or disassemble the dummy cover without the assistance of additional tools.

17 Claims, 16 Drawing Sheets

HOST CASING OF ELECTRONIC DEVICE AND DISASSEMBLY AND ASSEMBLY MODULE FOR DUMMY COVER

CROSS-REFERENCE TO RELATED APPLICATION

This non-provisional application claims priority under 35 U.S.C. § 119(a) to Patent Application No. 202011280209.X filed in China, P.R.C. on Nov. 16, 2020, the entire contents of which are hereby incorporated by reference.

BACKGROUND

Technical Field

The present disclosure relates to a host casing of an electronic device, and in particular, to a host casing of electronic device and disassembly and assembly module of a dummy cover.

Related Art

For device expandability of a server and helping maintenance personnel of the server voluntarily increase/reduce devices to be mounted on the server, the server has a plurality of receiving spaces with openings provided on a front of the server so that various pluggable devices (such as hard disks and/or optical disc drives) are inserted into corresponding receiving spaces through the openings and fixedly mounted in the corresponding receiving spaces.

In order to avoid an open cavity caused by the pre-reserved receiving space, a dummy cover is assembled at the opening of the unused receiving space on the server. However, during assembling of the dummy cover, the dummy cover is fixed on a host casing of the server by using a plurality of screws. Therefore, maintenance personnel need to assemble or disassemble the dummy cover with hand tools such as a screwdriver. As a result, actions of the assembly and disassembly of the cover plate are troublesome and inconvenient, increasing replacement complexity between the dummy cover and the pluggable device.

In addition, a disassembly and assembly structure for the dummy cover is disposed on some server for maintenance personnel to disassemble and assemble the dummy cover. However, the design of the existing disassembly and assembly structure affects an appearance of the server, causes low space utilization efficiency of the server, and affects heat dissipation efficiency of the server.

SUMMARY

In an embodiment, a host casing of an electronic device includes: a housing, a dummy cover, and a disassembly and assembly structure. A front side of the housing has an opening. The dummy cover is disposed in the opening of the housing. The disassembly and assembly structure is disposed inside the housing. The disassembly and assembly structure is configured to buckle with the dummy cover.

In an embodiment, a disassembly and assembly module of a dummy cover includes a disassembly and assembly structure. The disassembly and assembly structure is configured to simultaneously release the dummy cover and push the dummy cover out.

In summary, in the application of the host casing of the electronic device and the disassembly and assembly module of the dummy cover according to any embodiment, the dummy cover can be quickly assembled and/or quickly disassembled.

DETAILED DESCRIPTION

Figure 1:
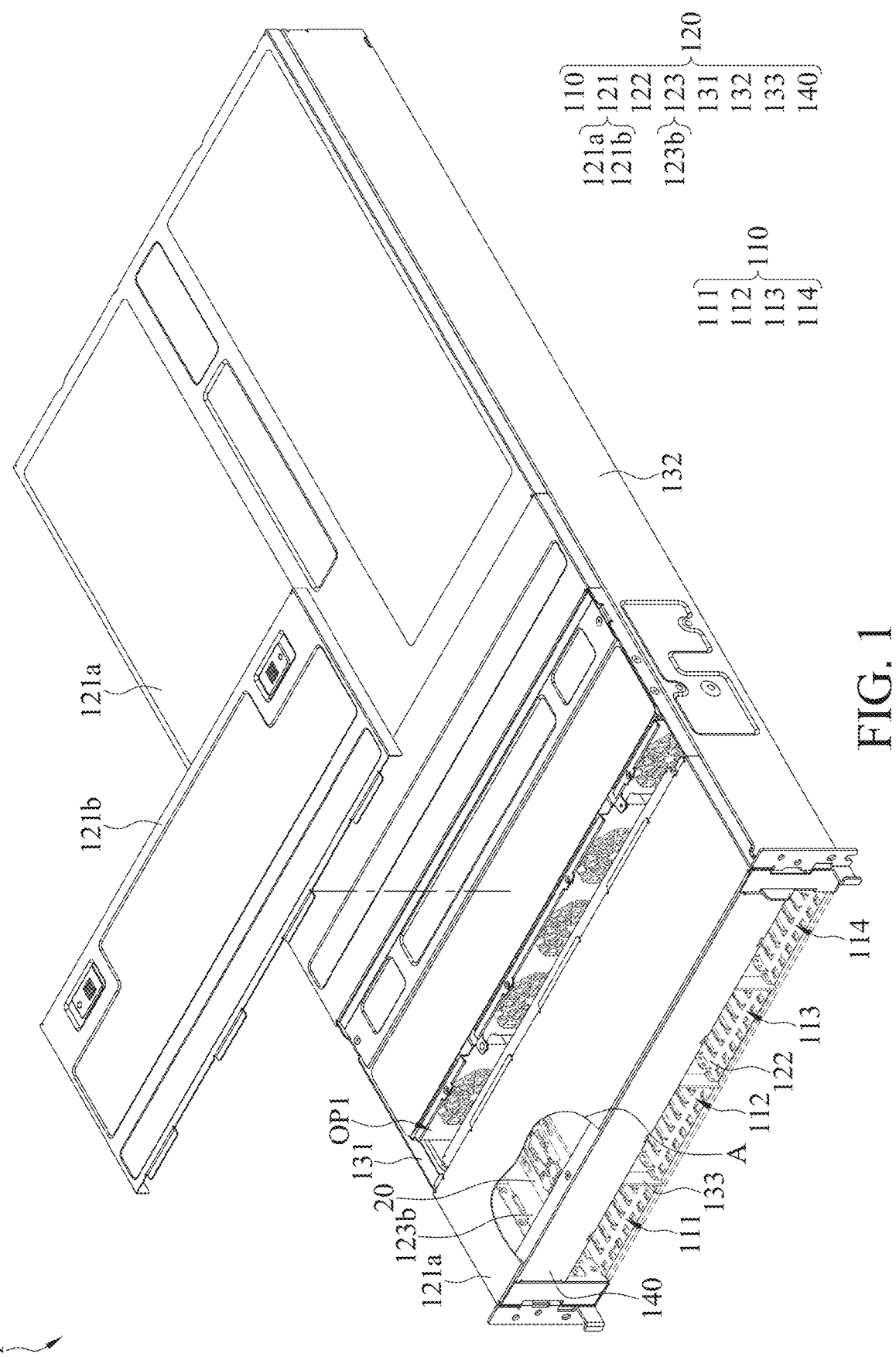
FIG. 1 is a schematic diagram of a host casing of an electronic device according to an embodiment.

Referring to FIG. 1, a host casing 1 of an electronic device includes: a housing 10 and one or more sets of disassembly and assembly structures 20. The housing 10 has one or more receiving spaces 110. Each of the disassembly and assembly structures 20 is disposed inside the housing 10 corresponding to one receiving space 110. In FIG. 1, the area A shows the internal components (such as components indicated by numbers 120 and 123b) of the host casing 1 are presented in a partially broken open manner.

In some embodiments, the housing 10 may be a cage. In other words, the housing 10 includes a top wall 121, a bottom wall 122, and two side walls 131 and 132. The two side walls 131 and 132 are opposite to each other and are coupled between the top wall 121 and the bottom wall 122. The housing 10 further includes one or more board layers 123. Each of the board layers 123 is between the top wall 121 and the bottom wall 122, and two sides (that is, a left side and a right side) of each of the board layers 123 are respectively fixed on the two side walls 131 and 132 to partition inside of the housing 10 into an upper layer and a lower layer. In an embodiment, an entire layer of space of the housing 10 may serve as the receiving space 110. In another embodiment, the entire layer of space of the housing 10 may be partitioned into a plurality of receiving spaces 111 to 114 by one or more partitions 133. In an exemplary embodiment, two sides (that is, an upper side and a lower side) of each partition 133 in the lowermost layer are respectively fixed on the board layer 123 and the bottom wall 122 adjacent to each other. In another exemplary embodiment, two sides (that is, an upper side and a lower side) of each partition 133 in the uppermost layer are respectively fixed on the top wall 121 and the board layer 123 adjacent to each other. In still another exemplary embodiment, two sides (that is, an upper side and a lower side) of each partition 133 in the intermediate layer are respectively fixed on two adjacent board layers 123. In some embodiments, numbers of receiving spaces 110 in all layers of the housing 10 may be the same or different.

Each receiving space 110 may be used to mount various pluggable devices (for example, hard disks or optical disk drives, etc.). In other words, the pluggable device may be inserted into a corresponding receiving space 110 through an opening 110a (which is formed by the side wall 131, the board layer 123, the partition 133, and a side of the bottom wall 122 located at the front side of the housing 10, or formed by two adjacent partitions 133, the board layer 123, and the side of the bottom wall 122 located at the front side of the housing 10, or formed by the partition 133, the board layer 123, the side wall 132, and the side of the bottom wall 122 located at the front side of the housing 10) of the receiving space 110 at the front side of the housing 10.

Figure 2:
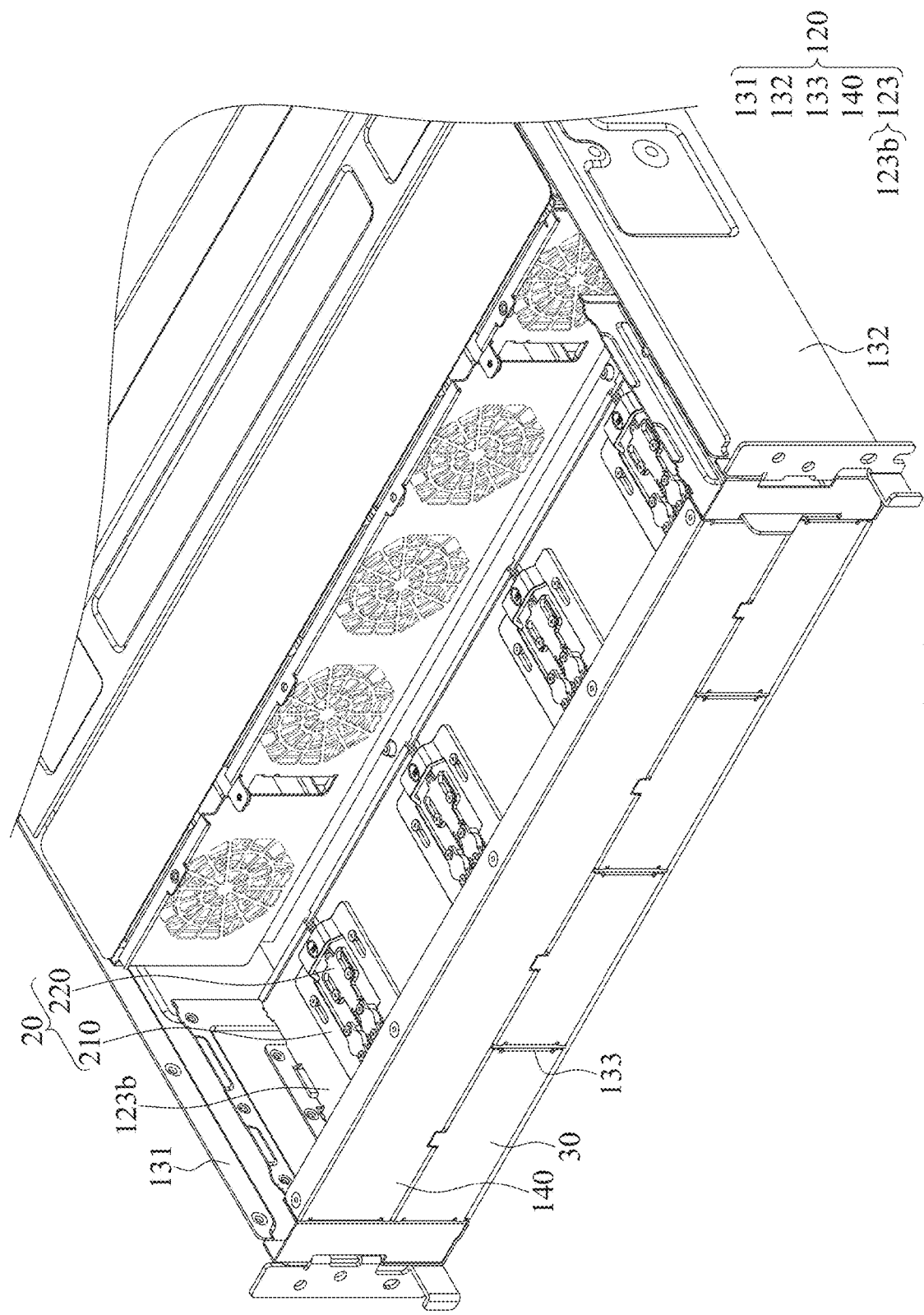
FIG. 2 is a schematic diagram of a first state of the host casing in FIG. 1 in a usage example.

When the receiving space 110 is not assembled with a corresponding pluggable device, the opening 110a of the receiving space 110 (that is, the opening 110a at the front side of the housing 10) may be covered by a detachable dummy cover 30, which is shown in FIG. 2. In other words, the dummy cover 30 may be assembled in the opening 110a of the receiving space 110.

Figure 3:
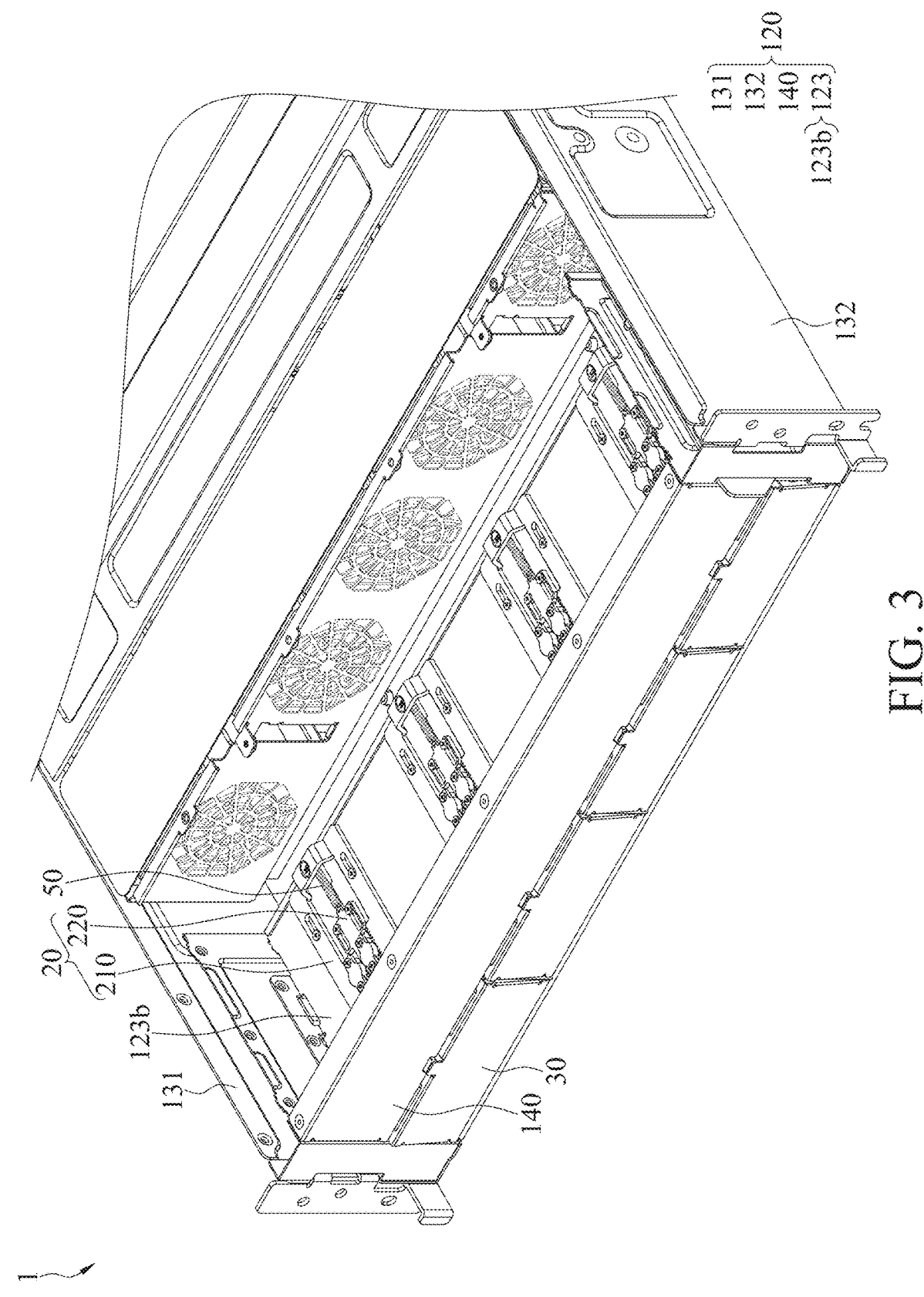
FIG. 3 is a schematic diagram of a second state of the host casing in FIG. 1 in a usage example.

The disassembly and assembly structure 20 has a first state and a second state herein. In the first state, the disassembly and assembly structure 20 buckles with the dummy cover 30, so that the dummy cover 30 is fixed in the opening 110a of the corresponding receiving space 110, which is shown in FIG. 2. In the second state, the disassembly and assembly structure 20 releases the dummy cover 30 and simultaneously pushes the dummy cover 30 out of the opening 110a of the receiving space 110, which is shown in FIG. 3. In FIG. 2 and FIG. 3, the top wall 121 is omitted for presenting the internal components of the host casing 1.

In some embodiments, the electronic device may be a server, a host, or a connector.

Referring to FIG. 1 to FIG. 3, for example, in a server with a two-layer space, an opening (that is, formed by the two side walls 131 and 132, the top wall 121, and a side of the board layer 123 located at the front side of the housing 10) of an upper space at the front side of the housing 10 is covered by a cover plate 140. In other words, the cover plate 140 is assembled at the opening of the upper space. The cover plate 140 may have a plurality of through holes (not shown) for circulation of air flows.

A lower space is partitioned into four receiving spaces 111 to 114 by three partitions 133. In other words, the board layer 123 is located at the top of the receiving spaces 111 to 114. A disassembly and assembly structure 20 corresponding to each board layer 123 are disposed on the board layers on the top of the receiving spaces 111 to 114.

Figure 4:
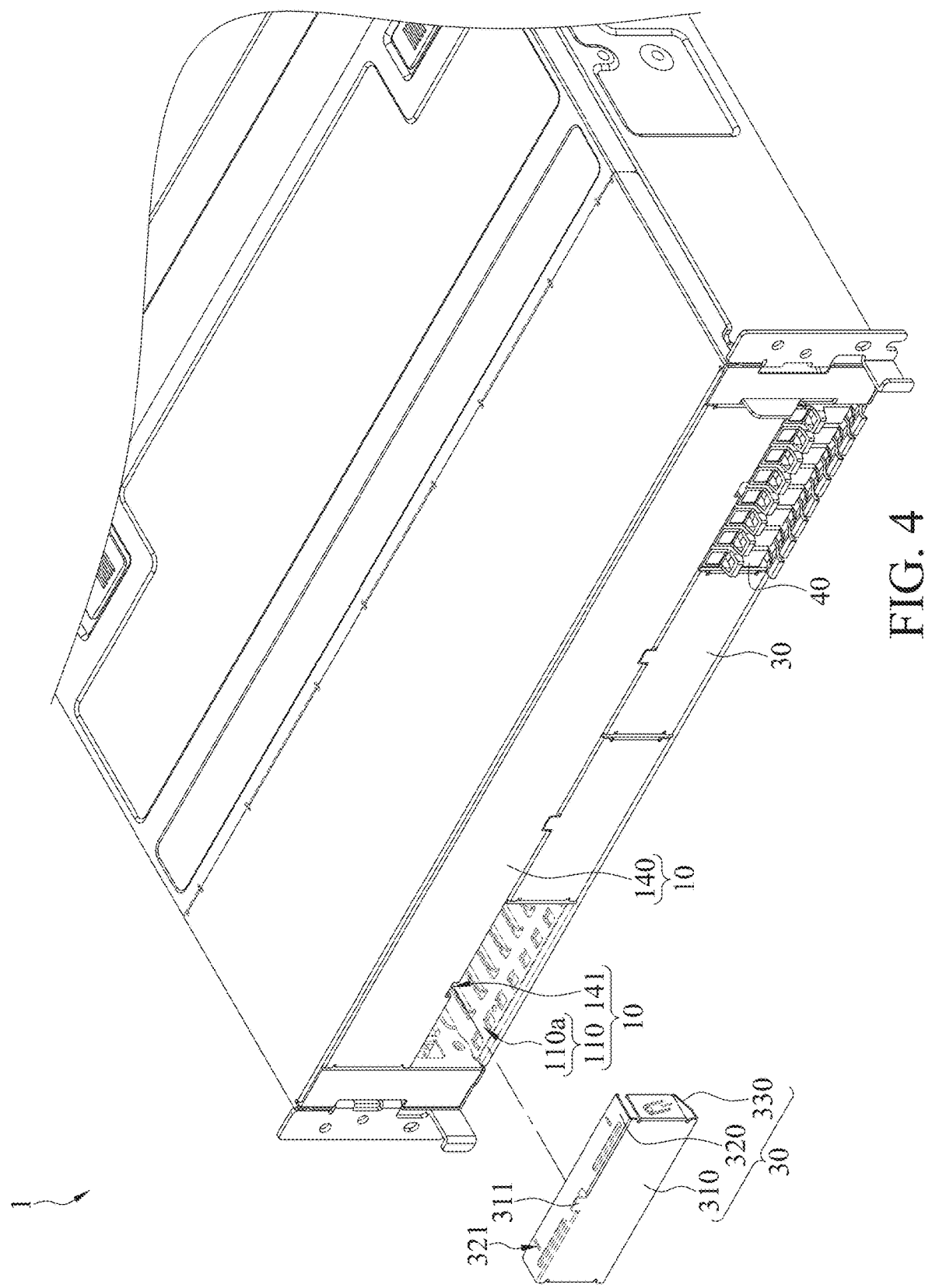
FIG. 4 is a schematic diagram of the host casing in FIG. 1 in another usage example.

One or more hard disks 40 may be inserted into a corresponding receiving space 110 through the opening 110a of the receiving space 110 at the front side of the housing 10, which is shown in FIG. 4.

In some embodiments, referring to FIG. 4, the dummy cover 30 includes a main board 310, an upper side plate 320, and a lower side plate 330. The upper side plate 320 and the lower side plate 330 stand on an inner surface of the main board 310 and are respectively located on an upper side and a lower side of the main board 310. In other words, the upper side plate 320, the main board 310, and the lower side plate 330 are substantially U-shaped.

A stop tab 311 protrudes from the upper side of the main board 310. When the dummy cover 30 is assembled in the opening 110a of the receiving space 110, the stop tab 311 protrudes out from the opening 110a of the receiving space 110 (that is, beyond the board layer 123). A lower side of the cover plate 140 may have a notch 141 matching the stop tab 311. When the dummy cover 30 is assembled in the opening 110a of the receiving space 110, the stop tab 311 may be accommodated in the notch 141.

The main board 310 may have a plurality of through holes (not shown) for circulation of air flows.

Figure 5:
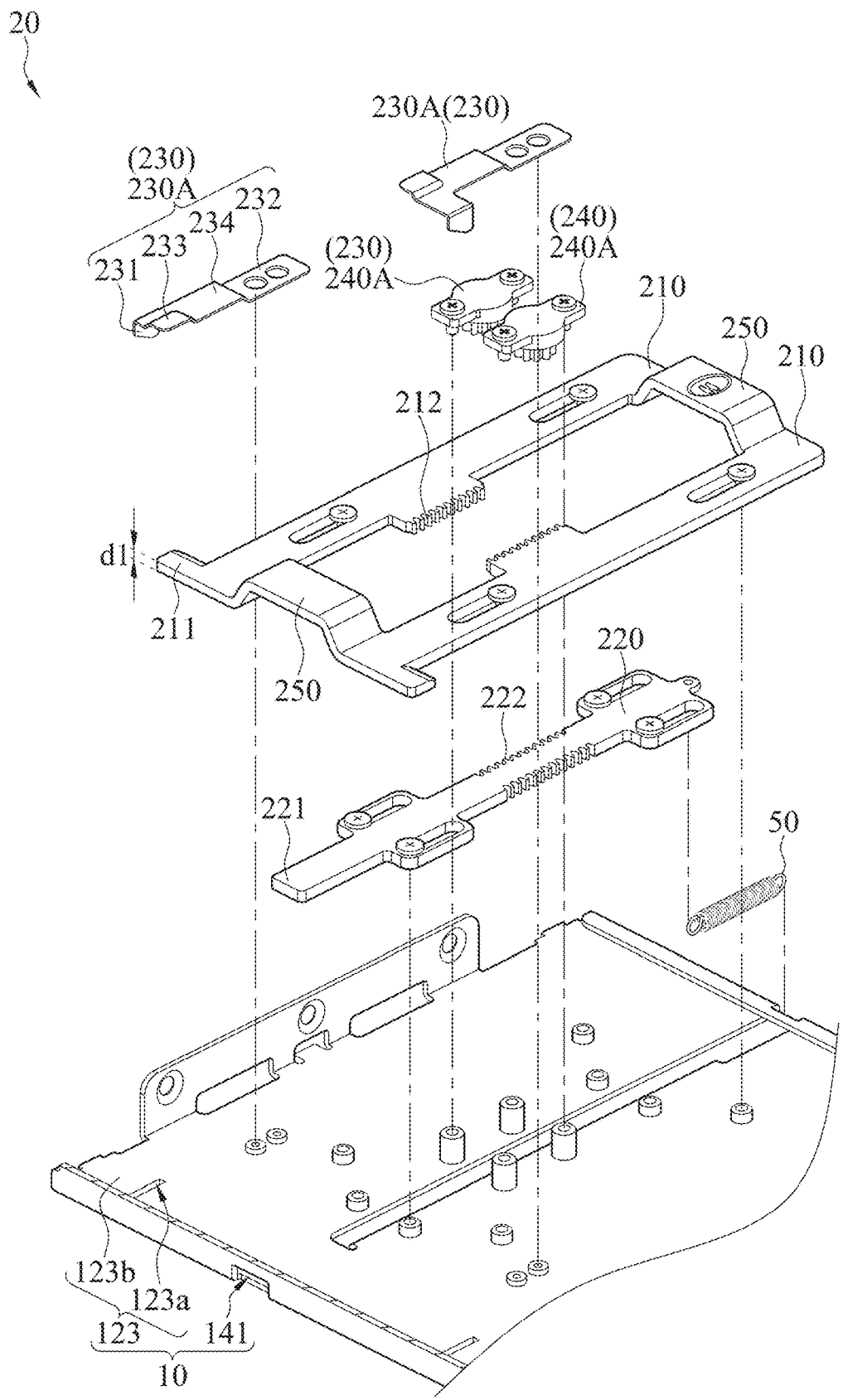
FIG. 5 is an exploded view of a first example of a disassembly and assembly structure in FIG. 2.

In some embodiments, referring to FIG. 2, FIG. 3, and FIG. 5, each disassembly and assembly structure 20 includes: an unbuckling member 210, a pushing member 220, and a buckling member 230. The unbuckling member 210 and the pushing member 220 are movably disposed on an upper surface 123b of the board layer 123. In other words, the unbuckling member 210 may move between a first position and a second position. The pushing member 220 may move between a third position and a fourth position.

Referring to FIG. 2, FIG. 5, FIG. 6, and FIG. 7, in the first state, the unbuckling member 210 is at the first position, the pushing member 220 is at the third position, and the buckling member 230 passes through the board layer 123 to buckle with the dummy cover 30 located at the opening 110a of the receiving space 110.

When the unbuckling member 210 moves toward the dummy cover 30 (that is, the unbuckling member 210 moves from the first position along the upper surface 123b of the board layer 123 to the second position), the unbuckling member 210 pushes the buckling member 230 away from the upper surface 123b of the board layer 123 so that the buckling member 230 releases the dummy cover 30. In addition, the unbuckling member 210 further drives the pushing member 220 to move toward the dummy cover 30 (that is, the pushing member 220 moves from the third position along the upper surface 123b of the board layer 123 to the fourth position) so that the pushing member 220 pushes the dummy cover 30 out of the opening 110a of the receiving space 110 by pushing the stop tab 311 located in the notch 141 out of the notch 141.

Figure 8:
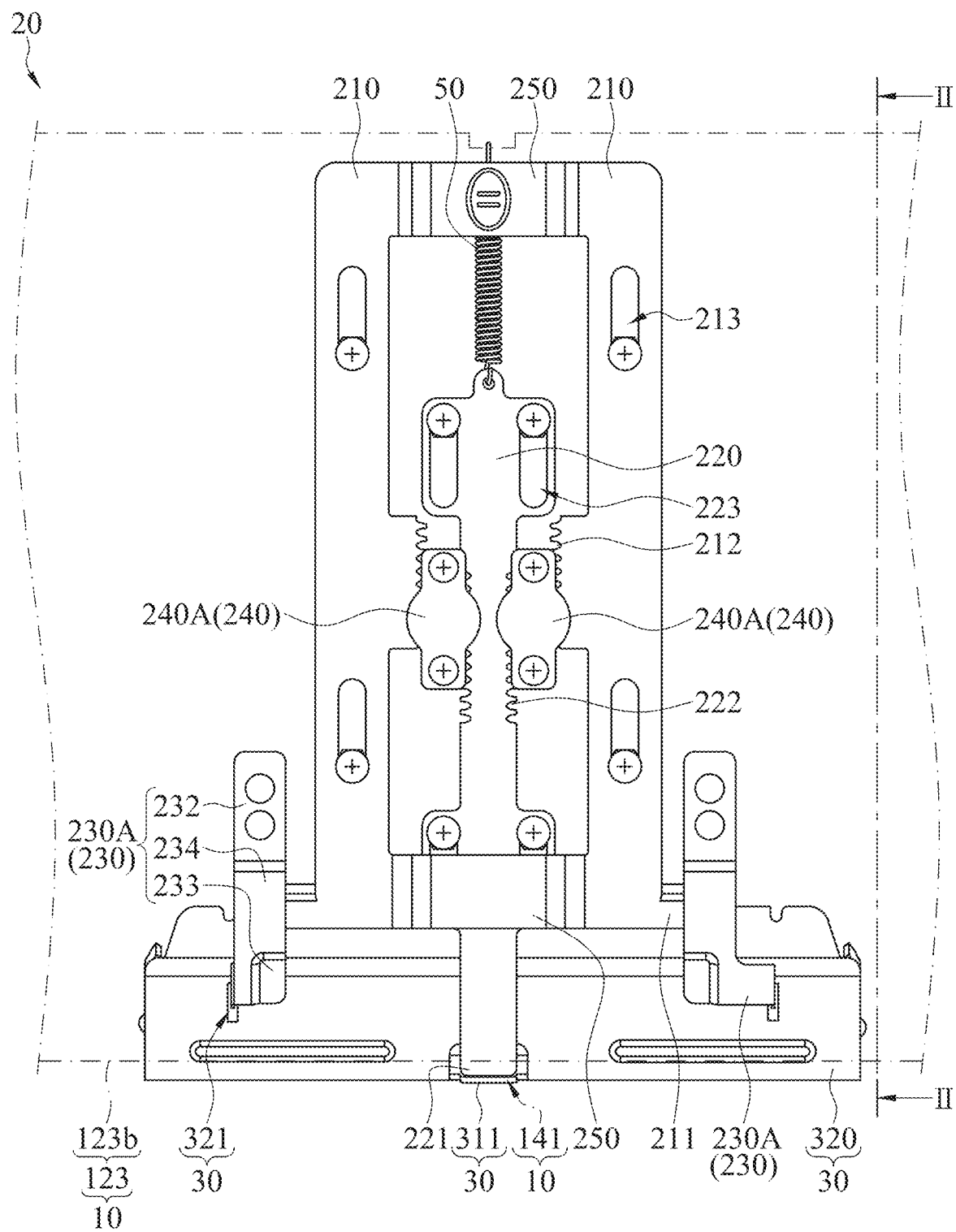
FIG. 8 is a top view of the disassembly and assembly structure in FIG. 5 in a second state.
Figure 9:
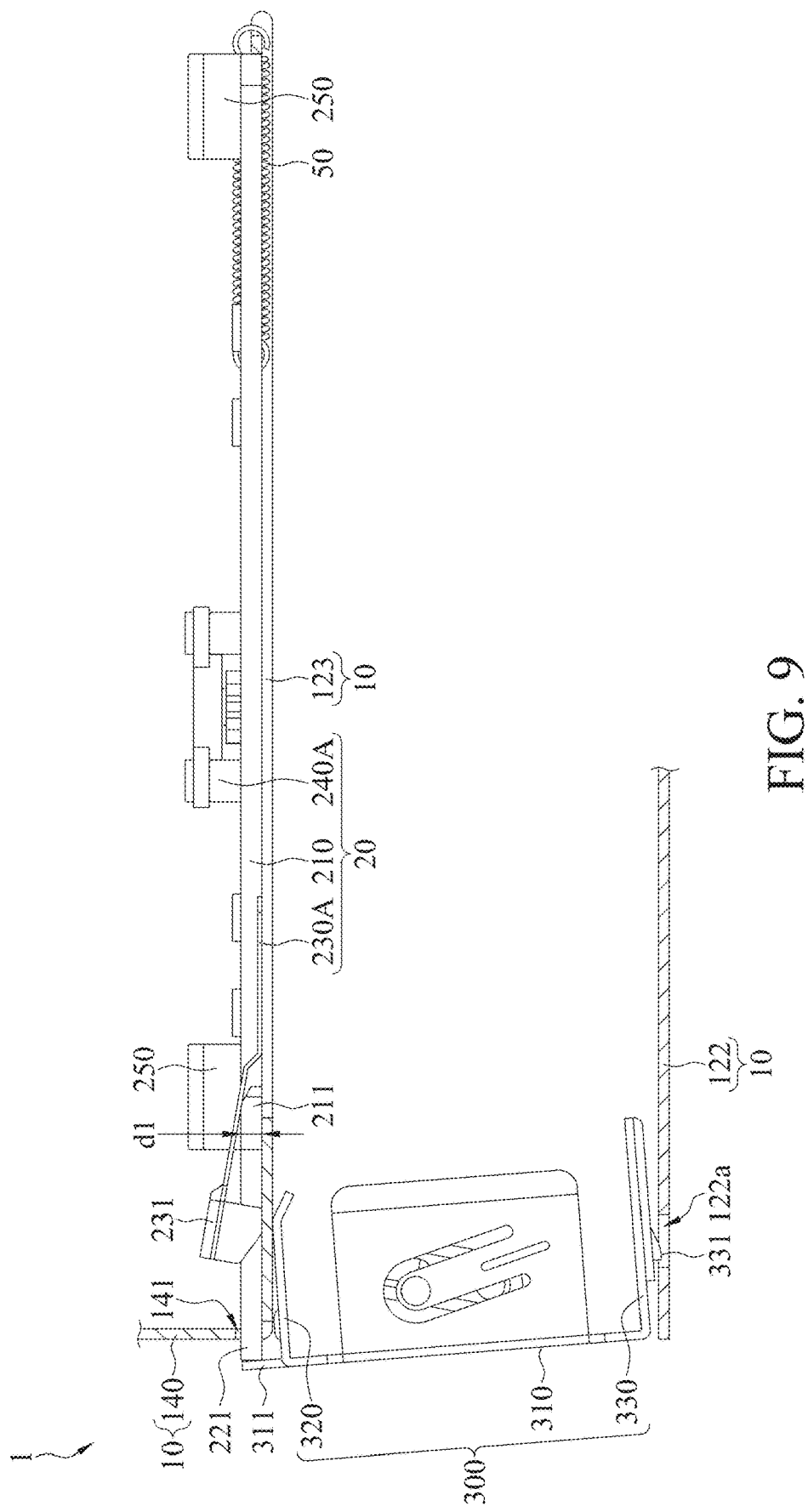
FIG. 9 is a cross-sectional view along a section line II-II in FIG. 8.

In other words, referring to FIG. 3, FIG. 8, and FIG. 9, the disassembly and assembly structure 20 is changed from the first state to the second state. In the second state, the unbuckling member 210 is at the first position, and the pushing member 220 is at the third position. The buckling member 230 releases the dummy cover 30 under pushing by the unbuckling member 210, and the pushing member 220 protrudes into or passes through the notch 141 against the stop tab 311 under linkage of the unbuckling member 210, thereby pushing the dummy cover 30 out of the opening 110a of the receiving space 110.

Figure 6:
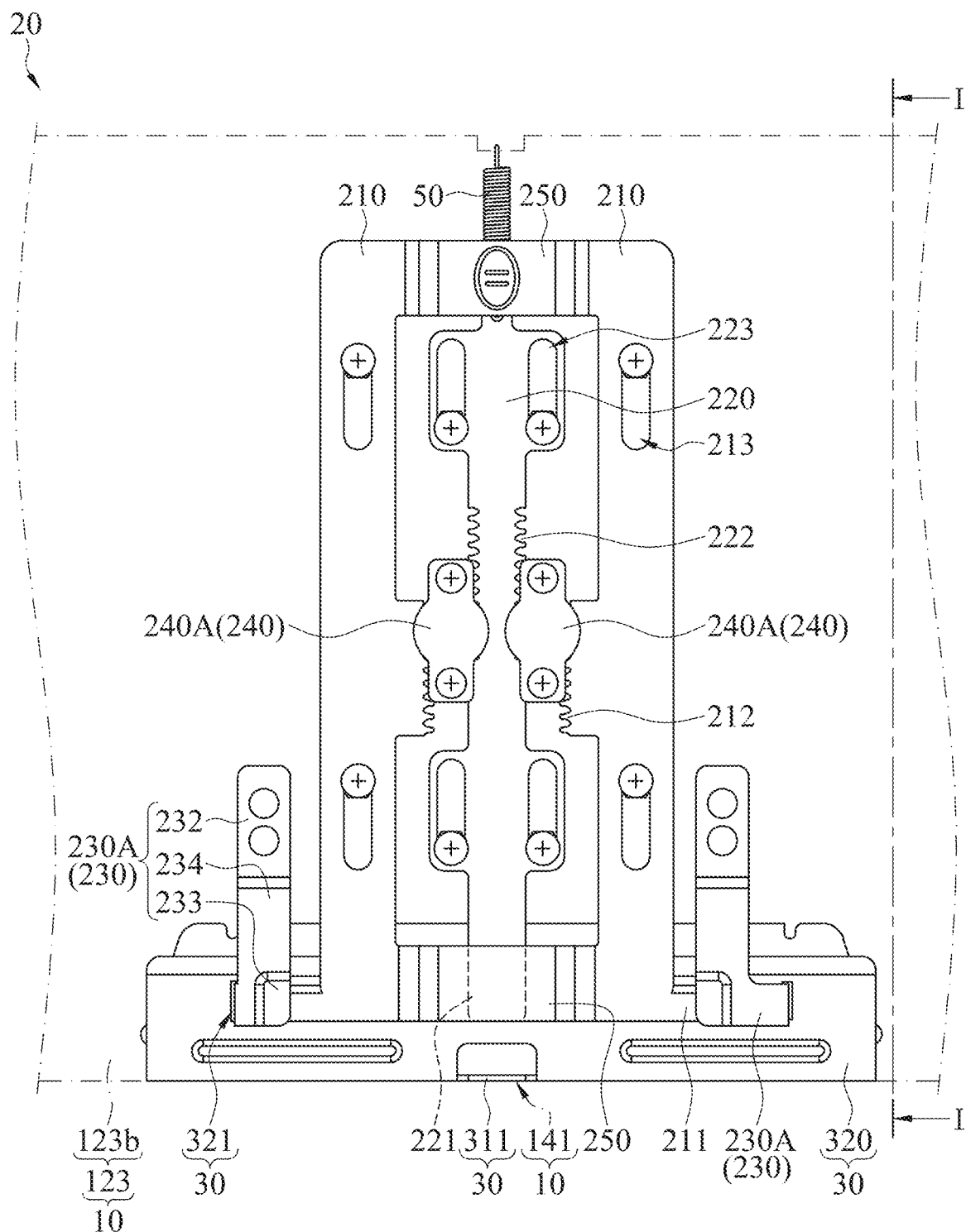
FIG. 6 is a top view of the disassembly and assembly structure in FIG. 5 in a first state.

In some embodiments, referring to FIG. 6 and FIG. 8, the unbuckling member 210 may have one or more hollowed chutes 213 extending along the moving direction of the unbuckling member 210 (that is, a direction of movement relative to the front side of the housing 10), and a fixing member (such as a screw, etc.) passes through the hollowed chute 213 to fix the unbuckling member 210 on the board layer 123. A width of the top end of the fixing member passing through the hollowed chute 213 is greater than a width of the hollowed chute 213, and a width of a section of the fixing member passing through the hollowed chute 213 is less than the width of the hollowed chute 213 herein. Therefore, the unbuckling member 210 can move on the board layer 123 under limit of the fixing member and guide (that is, relative sliding between the hollowed chute 213 and the fixing member) of the hollowed chute 213. Likewise, the pushing member 220 may have one or more hollowed chutes 223 extending along the moving direction of the pushing member 220 (that is, a direction of movement relative to the front side of the housing 10), and a fixing member (such as a screw, etc.) passes through the hollowed chute 223 to fix the pushing member 220 on the board layer 123. A width of the top end of the fixing member passing through the hollowed chute 223 is greater than a width of the hollowed chute 223, and a width of a section of the fixing member passing through the hollowed chute 223 is less than the width of the hollowed chute 223 herein. Therefore, the pushing member 220 can move on the board layer 123 under the limit of the fixing member and the guide (that is, the relative sliding between the hollowed chute 223 and the fixing member) of the hollowed chute 223.

Figure 7:
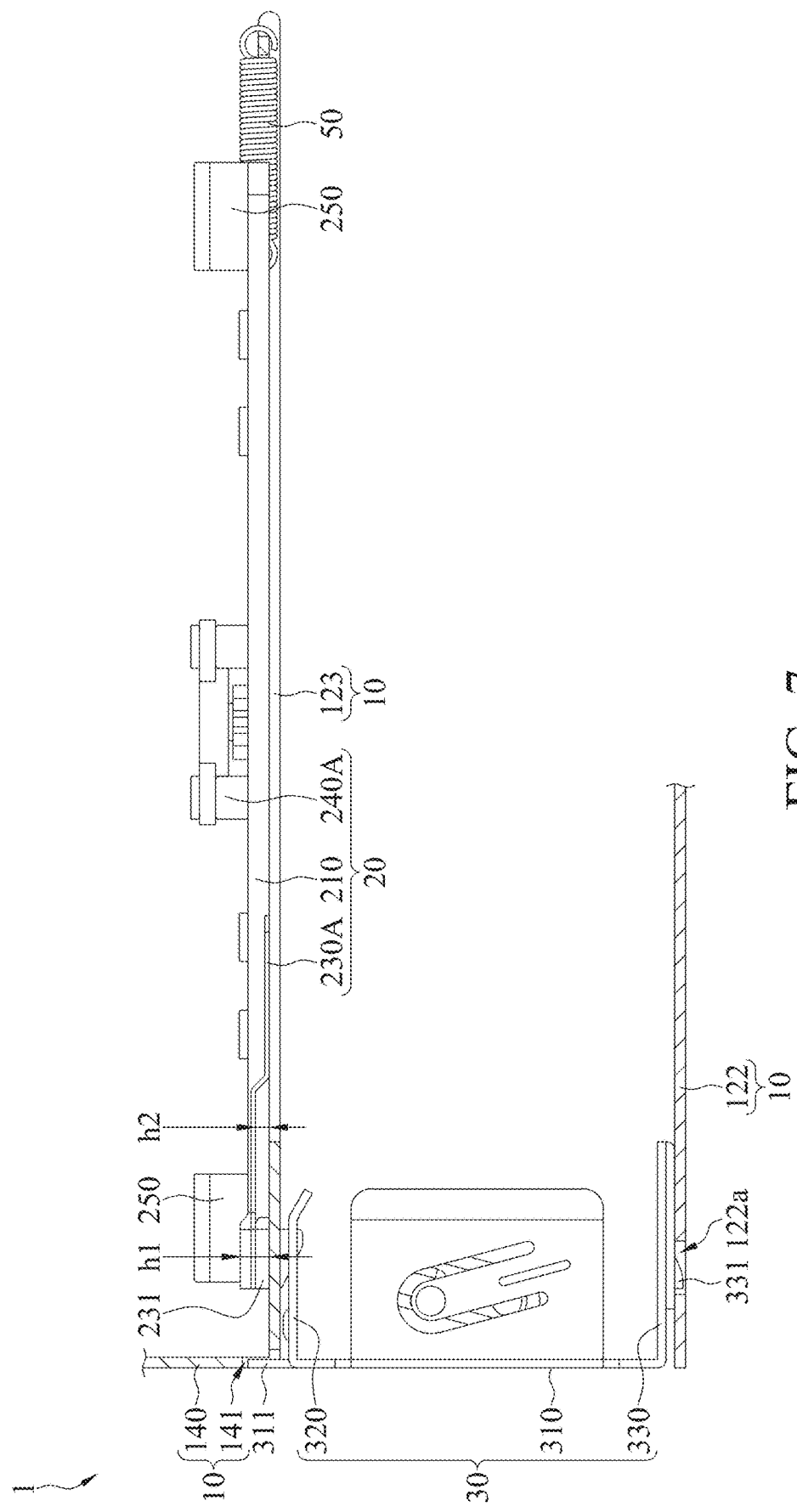
FIG. 7 is a cross-sectional view along a section line I-I in FIG. 6.

In some embodiments, referring to FIG. 5 to FIG. 9, the buckling member 230 may be a buckling elastic sheet 230A. A first end of the buckling elastic sheet 230A extends downward with a hook 231, and a second end 232 of the buckling elastic sheet 230A is fixed on the upper surface 123b of the board layer 123. Referring to FIG. 5 to FIG. 7, in the first state, the hook 231 passes through the board layer 123 to buckle with the dummy cover 30. For example, in response to a position of the hook 231 when the dummy cover 30 is assembled in the opening 110a of the receiving space 110, the board layer 123 has an opening 123a that allows the hook 231 to pass through, and the upper side plate 320 of the dummy cover 30 has a buckling hole 321. When the dummy cover 30 is assembled in the opening 110a of the receiving space 110, the buckling hole 321 on the upper side plate 320 of the dummy cover 30 is aligned with the opening 123a on the board layer 123, and the hook 231 passes through the opening 123a to be hooked on the buckling hole 321, so as to fix the dummy cover 30 at the opening 110a of the receiving space 110.

In some embodiments, referring to FIG. 4, FIG. 7, and FIG. 9, the lower side plate 330 of the dummy cover 30 may have a protruding structure 331 protruding downward. In response to a position of the protruding structure 331 when the dummy cover 30 is assembled in the opening 110a of the receiving space 110, the bottom wall 122 has an opening 122a configured to accommodate the protruding structure 331. During assembling of the dummy cover 30, a lower edge of the lower side plate 330 of the dummy cover 30 may be first caused to be in contact with a lower edge of the opening 110a of the receiving space 110, and then the lower edge of the lower side plate 330 is used as a fulcrum to turn the entire dummy cover 30 to the opening 110a of the receiving space 110 until the stop tab 311 of the dummy cover 30 leans against an inner edge of the notch 141 (that is, an edge of the board layer 123 in the notch 141) herein. In this case, the hook 231 of the buckling elastic sheet 230A passes through the opening 123a to be hooked on the buckling hole 321, and the protruding structure 331 of the dummy cover 30 is engaged in the opening 122a of the bottom wall 122. Therefore, the dummy cover 30 can be firmly assembled at the opening 110a of the receiving space 110.

In some embodiments, referring to FIG. 4, FIG. 5, FIG. 7, and FIG. 9, there is a first height h1 (that is, a height of a section 233) and a second height h2 (that is, a height of a section 234) between an extension line (that is, the upper surface 123b of the board layer 123) of a lower surface of the second end 232 of the buckling elastic sheet 230A and lower surfaces of the sections 233 and 234 of the buckling elastic sheet 230A other than the second end 232. The first height h1 is greater than the second height h2. The unbuckling member 210 has a pushing tab 211. The pushing tab 211 is located between the buckling elastic sheet 230A and the dummy cover 30 (or the board layer 123). The pushing tab 211 has a thickness d1. The thickness d1 is greater than or less than the first height h1 and greater than the second height h2.

When the unbuckling member 210 moves from the first position to the second position, the pushing tab 211 moves from the first height h1 to the second height h2, that is, moves from a position below the section 233 to a position below the section 234. In addition, since the thickness d1 of the pushing tab 211 is greater than the second height h2, when the pushing tab 211 moves to a position below the section 234, the pushing tab 211 leans against the section 234 and moves the section 234 upward away from the board layer 123 (that is, in a direction away from the board layer 123), so that the first end of the buckling elastic sheet 230A is lifted by using the second end 232 of the buckling elastic sheet 230A as a fulcrum, causing the hook 231 to leave the buckling hole 321.

In some embodiments, the disassembly and assembly structure 20 may further include: a linkage member 240. When the unbuckling member 210 moves relative to the dummy cover 30, the unbuckling member 210 drives the pushing member 220 through the linkage member 240.

In some embodiments, referring to FIG. 5, FIG. 6, and FIG. 8, the linkage member 240 may be a gear 240A. The gear 240A is coupled between the unbuckling member 210 and the pushing member 220. One side of the unbuckling member 210 adjacent to the pushing member 220 has a first rack 212 engaged with the gear 240A. One side of the pushing member 220 adjacent to the unbuckling member 210 has a second rack 222 engaged with the gear 240A.

For example, referring to FIG. 5, FIG. 6, and FIG. 8, relative to the first end of the buckling elastic sheet 230A, the second end 232 of the buckling elastic sheet 230A is fixed on the upper surface 123b of the board layer 123 away from the front side of the housing 10 (that is, away from the opening 110a of the corresponding receiving space 110). The section 233 having the first height h1 is located at the first end of the buckling elastic sheet 230A, that is, relative to the second height h2, the first height h1 is adjacent to the first end of the buckling elastic sheet 230A. The section 234 having the second height h2 is located between the second end 232 of the buckling elastic sheet 230A and the section 233.

Referring to FIG. 6 and FIG. 7, in the first state, the unbuckling member 210 is at a position (that is, the first position) adjacent to the opening 110a of the corresponding receiving space 110 relative to the second position thereof, the pushing tab 211 of the unbuckling member 210 is located below the section 233, and the pushing member 220 is at a position (that is, the third position) away from the opening 110a of the corresponding receiving space 110 relative to the fourth position thereof. In this case, the hook 231 passes through the opening 123a of the board layer 123 to be hooked on the buckling hole 321 of the dummy cover 30.

When the unbuckling member 210 moves toward a rear side of the housing 10 (that is, moves away from the opening 110a of the corresponding receiving space 110) under an external force, the pushing tab 211 of the unbuckling member 210 moves from the position below the section 233 to a position below the section 234. Moreover, because the first rack 212 of the unbuckling member 210 and the second rack 222 of the pushing member 220 are respectively engaged on two opposite sides of the gear 240A, when the unbuckling member 210 moves, the unbuckling member 210 drives, through the gear 240A, the pushing member 220 to move in a direction opposite to the moving direction of the unbuckling member 210, that is, to move toward the opening 110a of the corresponding receiving space 110, so that a front end 221 of the pushing member 220 leans against the stop tab 311 of the dummy cover 30 located in the notch 141. Then the front end protrudes into or passes through the notch 141 against the stop tab 311 to push an upper half of the dummy cover 30 out of the opening 110a of the corresponding receiving space 110.

Referring to FIG. 8 and FIG. 9, in the second state, the unbuckling member 210 moves to a position (that is, the second position) away from the opening 110a of the corresponding receiving space 110, the pushing tab 211 of the unbuckling member 210 moves to a position below the section 234, and the pushing member 220 moves to a position (that is, the fourth position) adjacent to the opening 110a of the corresponding receiving space 110. In other words, at the fourth position, the pushing tab 211 of the unbuckling member 210 pushes the buckling elastic sheet 230A upward from a position below the section 234 so that the hook 231 leaves the buckling hole 321, and the front end 221 of the pushing member 220 protrudes into or passes through the notch 141 and pushes the upper half of the dummy cover 30 out of the opening 110a of the corresponding receiving space 110.

In some embodiments, referring to FIG. 5, FIG. 6, and FIG. 8, in each disassembly and assembly structure set 20, a single pushing member 220 operates with two unbuckling members 210, and the two unbuckling members 210 are respectively located on two opposite sides of the pushing member 220. Sides of the two unbuckling members 210 adjacent to the pushing member 220 have a first rack 212, and the two sides of the pushing member 220 respectively have a second rack 222 corresponding to the first racks 212 of the two unbuckling members 210. Each of the first racks 212 and the corresponding second rack 222 are respectively engaged on the two opposite sides of the gear 240A, so that the two unbuckling members 210 are respectively linked with the pushing member 220 through the two gears 240A. Each of the unbuckling members 210 can operate with one buckling elastic sheet 230A according to the above arrangement principle of the buckling elastic sheet 230A.

In some embodiments, referring to FIG. 5, FIG. 6 and FIG. 8, in each disassembly and assembly structure set 20, a plurality of unbuckling members 210 may be connected to each other by using one or more connecting members 250, to form an unbuckling rod for application of a force so that the plurality of unbuckling members 210 act in synchronization. In some embodiments, the unbuckling rod (that is, the plurality of unbuckling members 210 and the one or more connecting members 250) may be integrally formed.

Figure 10:
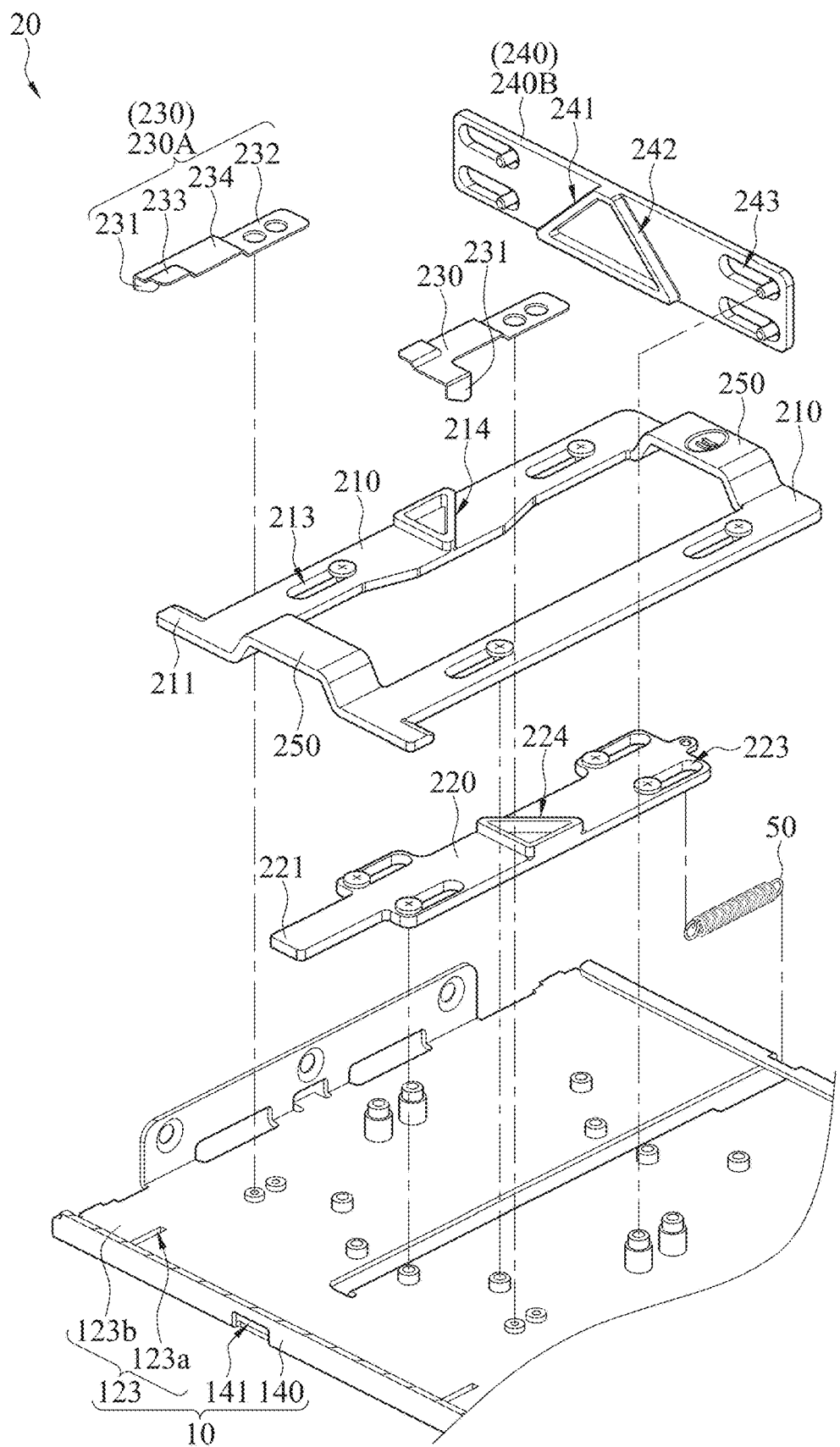
FIG. 10 is an exploded view of a second example of the disassembly and assembly structure.
Figure 11:
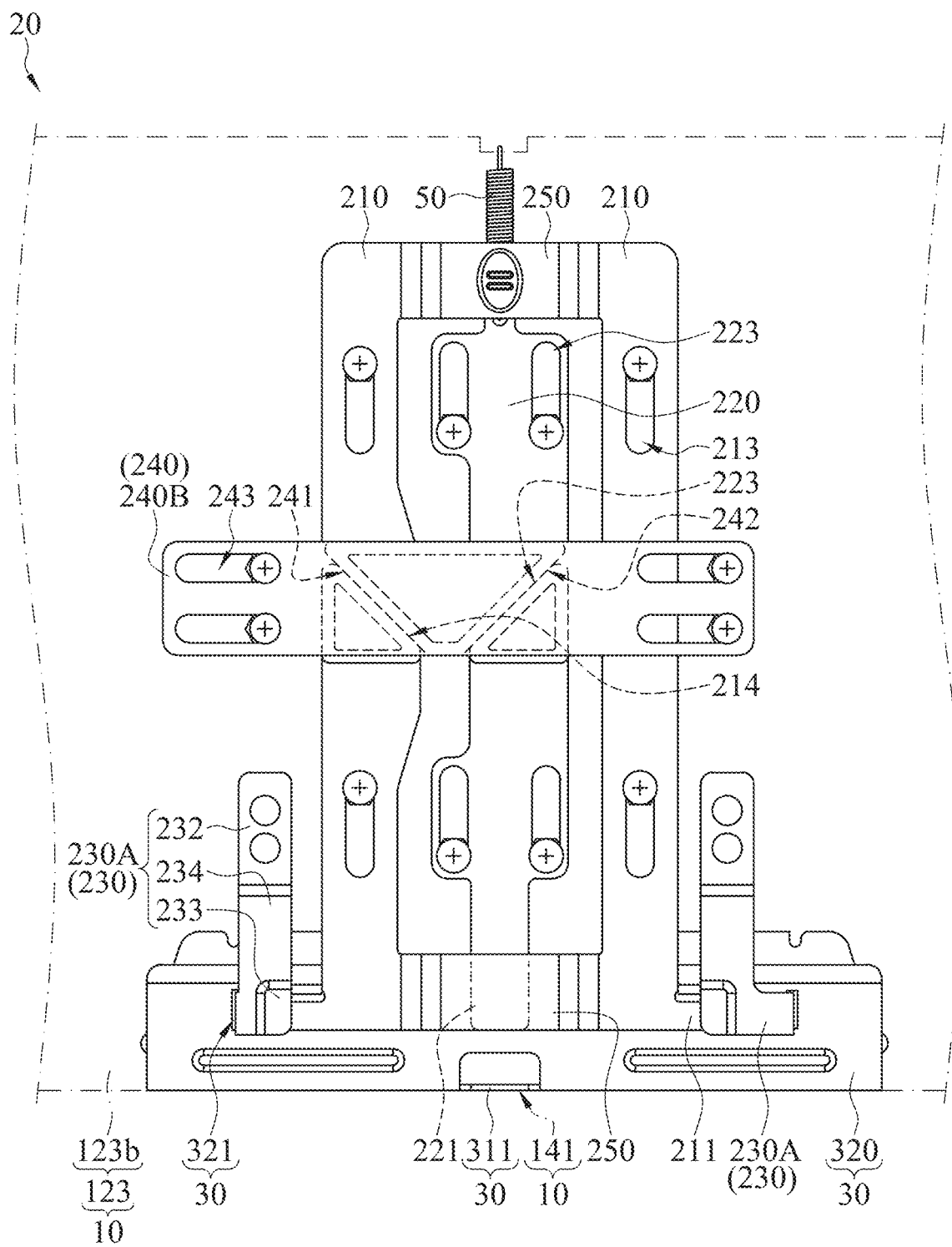
FIG. 11 is a top view of the disassembly and assembly structure in FIG. 10 in a first state.
Figure 12:
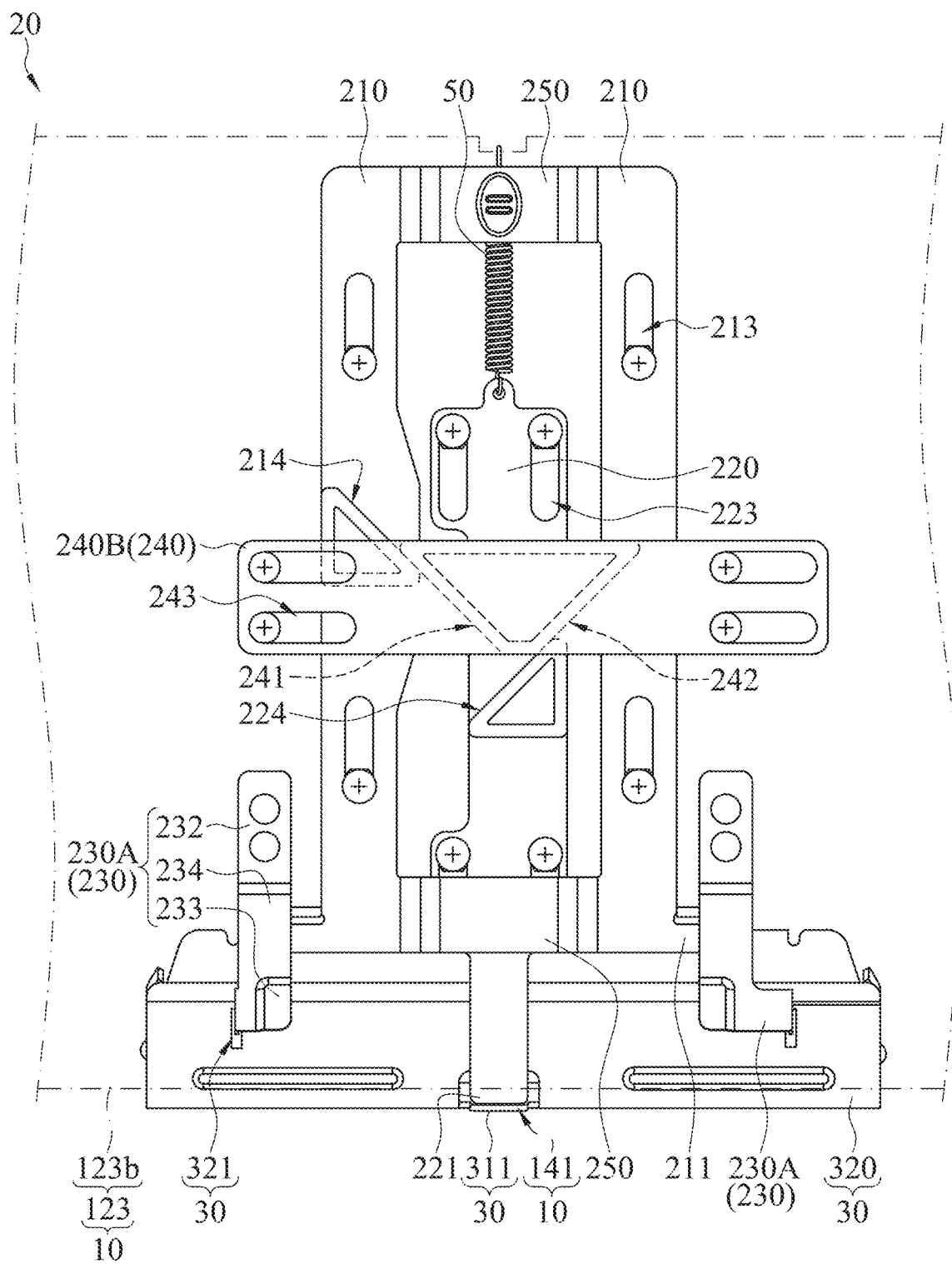
FIG. 12 is a top view of the disassembly and assembly structure in FIG. 10 in a second state.

In some embodiments, referring to FIG. 10, FIG. 11, and FIG. 12, the linkage member 240 may be a conversion crossbar 240B. The conversion crossbar 240B is movably disposed on the unbuckling member 210 and the pushing member 220. A moving direction of the conversion crossbar 240B is substantially perpendicular to the moving direction of the unbuckling member 210. In some embodiments, the conversion crossbar 240B may have one or more hollowed chutes 243 extending along the moving direction of the conversion crossbar 240B (that is, a direction substantially perpendicular to the moving direction of the unbuckling member 210), and a fixing member (such as a screw, etc.) passes through the hollowed chute 243 to fix the conversion crossbar 240B on the board layer 123. A width of the top end of the fixing member passing through the hollowed chute 243 is greater than a width of the hollowed chute 243, and a width of a section of the fixing member passing through the hollowed chute 243 is less than the width of the hollowed chute 243 herein. Therefore, the conversion crossbar 240B can move on the board layer 123 under the limit of the fixing member and the guide (that is, the relative sliding between the hollowed chute 243 and the fixing member) of the hollowed chute 243.

The conversion crossbar 240B has two inclined surfaces (which are referred to as a first inclined surface 241 and a second inclined surface 242 below). The upper surface of the unbuckling member 210 has an inclined surface (which is referred to as a third inclined surface 214 below) matching the first inclined surface 241 of the conversion crossbar 240B, and the upper surface of the pushing member 220 has an inclined surface (which is referred to as a fourth inclined surface 224 below) matching the second inclined surface 242 of the conversion bar 240B. When the unbuckling member 210 moves relative to the dummy cover 30, a relationship between the two inclined surfaces matching each other (that is, between the first inclined surface 241 and the third inclined surface 214 and between the second inclined surface 242 and the fourth inclined surface 224) switches between being attached to each other and being staggered from each other, so as to drive the pushing member 220 to move relative to the dummy cover 30. The two inclined surfaces matching each other mean that two inclined surfaces with a same slope abut each other. In other words, the first inclined surface 241 and the third inclined surface 214 have a same slope and abut each other. The second inclined surface 242 and the fourth inclined surface 224 have a same slope and abut each other.

For example, referring to FIG. 10, FIG. 11, and FIG. 12, relative to the first end of the buckling elastic sheet 230A, the second end 232 of the buckling elastic sheet 230A is fixed on the upper surface 123b of the board layer 123 away from the front side of the housing 10 (that is, away from the opening 110a of the corresponding receiving space 110). The section 233 having the first height h1 is located at the first end of the buckling elastic sheet 230A, that is, relative to the second height h2, the first height h1 is adjacent to the first end of the buckling elastic sheet 230A. The section 234 having the second height h2 is located between the second end 232 of the buckling elastic sheet 230A and the section 233.

The third inclined surface 214 is located on the upper surface of the unbuckling member 210, and obliquely extends from a position away from the pushing member 220 and the front side of the housing 10 to a position adjacent to the pushing member 220 and the front side of the housing 10. The fourth inclined surface 224 is located on the upper surface of the pushing member 220, and obliquely extends from a position away from the unbuckling member 210 and the front side of the housing 10 to a position adjacent to the unbuckling member 210 and the front side of the housing 10. The first inclined surface 241 is located on a lower surface of the conversion crossbar 240B corresponding to the third inclined surface 214, and the second inclined surface 242 is located on the lower surface of the conversion crossbar 240B corresponding to the fourth inclined surface 224. Moreover, when the conversion crossbar 240B is disposed on the unbuckling member 210 and the pushing member 220, the first inclined surface 241 and the second inclined surface 242 are located between the third inclined surface 214 and the fourth inclined surface 224, the first inclined surface 241 abuts the third inclined surface 214, and the second inclined surface 242 abuts the fourth inclined surface 224.

Referring to FIG. 11, in the first state, the unbuckling member 210 is at a position (that is, the first position) adjacent to the opening 110a of the corresponding receiving space 110 relative to the second position thereof, the pushing tab 211 of the unbuckling member 210 is located below the section 233, and the pushing member 220 is at a position (that is, the third position) away from the opening 110a of the corresponding receiving space 110 relative to the fourth position thereof. In this case, the first inclined surface 241 is attached to the third inclined surface 214, and the second inclined surface 242 is attached to the fourth inclined surface 224. In addition, the hook 231 passes through the opening 123a of the board layer 123 to be hooked on the buckling hole 321 of the dummy cover 30.

When the unbuckling member 210 moves toward the rear side of the housing 10 (that is, moves away from the opening 110a of the corresponding receiving space 110) under an external force (that is, a force of pulling the unbuckling member 210 toward the rear side of the housing 10), the pushing tab 211 of the unbuckling member 210 moves from the position below the section 233 to the position below the section 234. Moreover, when the unbuckling member 210 moves, since the first inclined surface 241 and the third inclined surface 214 are gradually staggered and the conversion crossbar 240B is limited to move in a direction substantially perpendicular to the moving direction of the unbuckling member 210, the second inclined surface 242 and the fourth inclined surface 224 are gradually staggered due to linkage of the conversion crossbar 240B (that is, the conversion crossbar provides the pushing member 220 with a pushing force in a direction opposite to the direction of the external force), continuously pushing the pushing member 220 to cause the pushing member to move in a direction opposite to the moving direction of the unbuckling member 210, that is, to gradually move toward the opening 110a of the corresponding receiving space 110, so that a front end 221 of the pushing member 220 leans against the stop tab 311 of the dummy cover 30 located in the notch 141. Then the front end protrudes into or passes through the notch 141 against the stop tab 311 to push an upper half of the dummy cover 30 out of the opening 110a of the corresponding receiving space 110.

Referring to FIG. 12, in the second state, the unbuckling member 210 moves to a position (that is, the second position) away from the opening 110a of the corresponding receiving space 110, the pushing tab 211 of the unbuckling member 210 moves to a position below the section 234, and the pushing member 220 moves to a position (that is, the fourth position) adjacent to the opening 110a of the corresponding receiving space 110. In other words, at the fourth position, the pushing tab 211 of the unbuckling member 210 pushes the buckling elastic sheet 230A upward from a position below the section 234 so that the hook 231 leaves the buckling hole 321, and the front end 221 of the pushing member 220 protrudes into or passes through the notch 141 and pushes the upper half of the dummy cover 30 out of the opening 110a of the corresponding receiving space 110.

In some embodiments, referring to FIG. 11 and FIG. 12, in each disassembly and assembly structure set 20, a single pushing member 220 operates with two unbuckling members 210, and the two unbuckling members 210 are respectively located on two opposite sides of the pushing member 220. A plurality of unbuckling members 210 may be connected to each other by using one or more connecting members 250 herein, to form an unbuckling rod for application of a force so that the plurality of unbuckling members 210 act in synchronization. In this case, a third inclined surface 214 is disposed one of the plurality of unbuckling members 210 as described above, and no third inclined surfaces 214 are disposed on others of the plurality of unbuckling members. Therefore, when the unbuckling rod moves under a force, the pushing member 220 is driven to move due to relative displacement between the third inclined surface 214 and the first inclined surface 241 of the conversion crossbar 240B and the relative displacement between the second inclined surface 242 of the conversion crossbar 240B and the fourth inclined surface 224 of the pushing member 220. Each of the unbuckling members 210 can operate with one buckling elastic sheet 230A according to the above arrangement principle of the buckling elastic sheet 230A (shown in FIG. 11 and FIG. 12) herein. In some embodiments, the unbuckling rod (that is, the plurality of unbuckling members 210 and the one or more connecting members 250) may be integrally formed.

In another exemplary embodiment, the buckling elastic sheet 230A may also be mounted reversely (not shown). In other words, relative to the first end of the buckling elastic sheet 230A, the second end 232 of the buckling elastic sheet 230A is fixed on the upper surface 123b of the board layer 123 adjacent to the front side of the housing 10 (that is, adjacent to the opening 110a of the corresponding receiving space 110). In this case, the section 233 having the first height h1 is located at the second end 232 of the buckling elastic sheet 230A, that is, relative to the second height h2, the first height h1 is adjacent to the second end 232 of the buckling elastic sheet 230A. The section 234 having the second height h2 is located between the first end of the buckling elastic sheet 230A and the section 233. In the first state, the pushing tab 211 of the unbuckling member 210 is located below the section 233. When the unbuckling member 210 moves toward the rear side of the housing 10 (that is, moves away from the opening 110a of the corresponding receiving space 110) under an external force, the pushing tab 211 moves from the position below the section 233 to the position below the section 234. In the second state, the pushing tab 211 of the unbuckling member 210 pushes the buckling elastic sheet 230A upward from the position below the section 234 so that the hook 231 leaves the buckling hole 321.

In some embodiments, referring to FIG. 13 to FIG. 17, the pushing member 220 may be connected to an end of the unbuckling member 210 adjacent to the front side of the housing 10 (that is, adjacent to the opening 110a of the receiving space 110). In this case, the first position of the unbuckling member 210 is away from the opening 110a of the corresponding receiving space 110, and the second position of the unbuckling member 210 is adjacent to the opening 110a of the corresponding receiving space 110. The third position of the pushing member 220 is away from the opening 110a of the corresponding receiving space 110, and the fourth position of the pushing member 220 is adjacent to the opening 110a of the corresponding receiving space 110.

Figure 13:
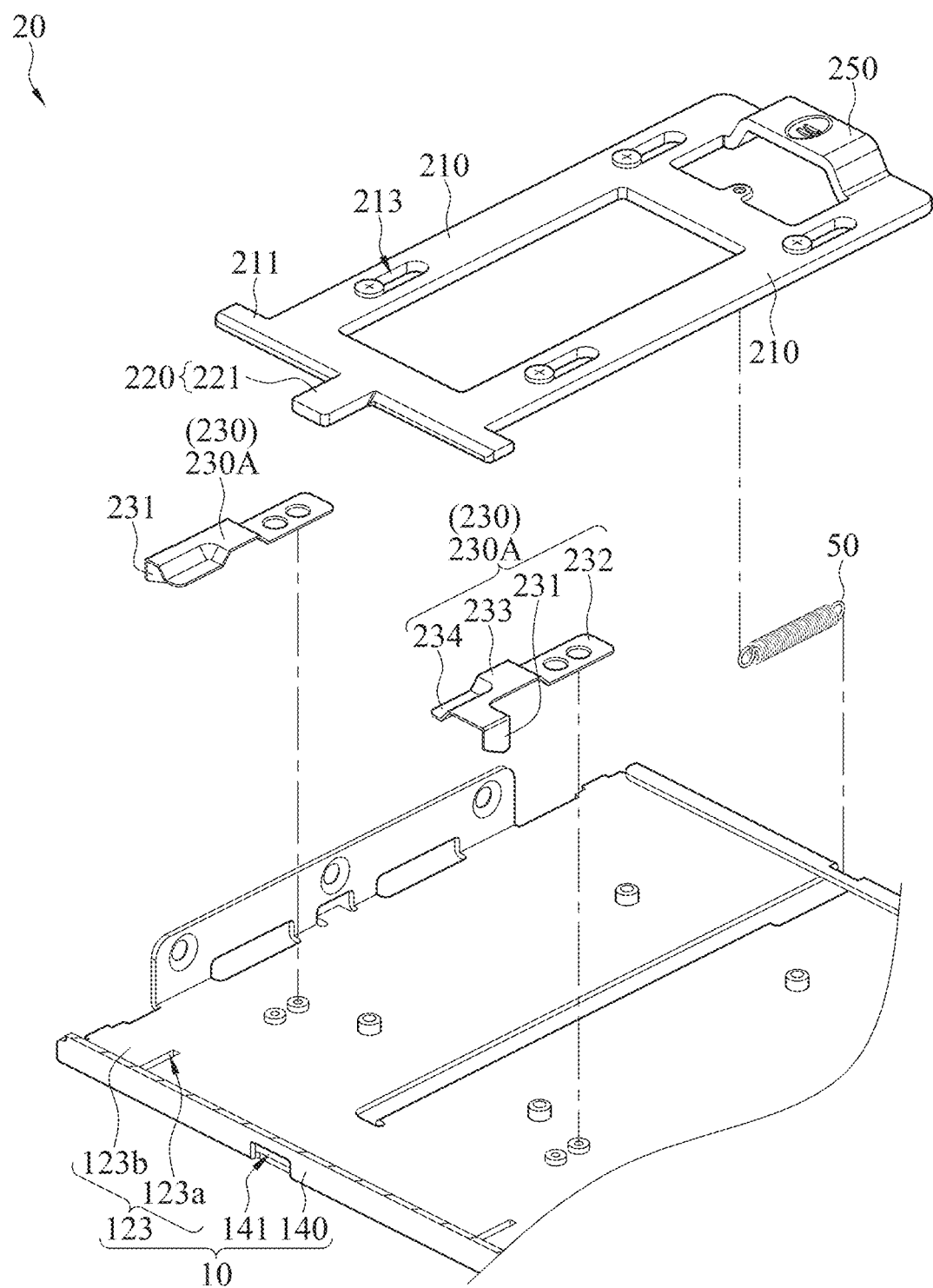
FIG. 13 is an exploded view of a third example of the disassembly and assembly structure.
Figure 14:
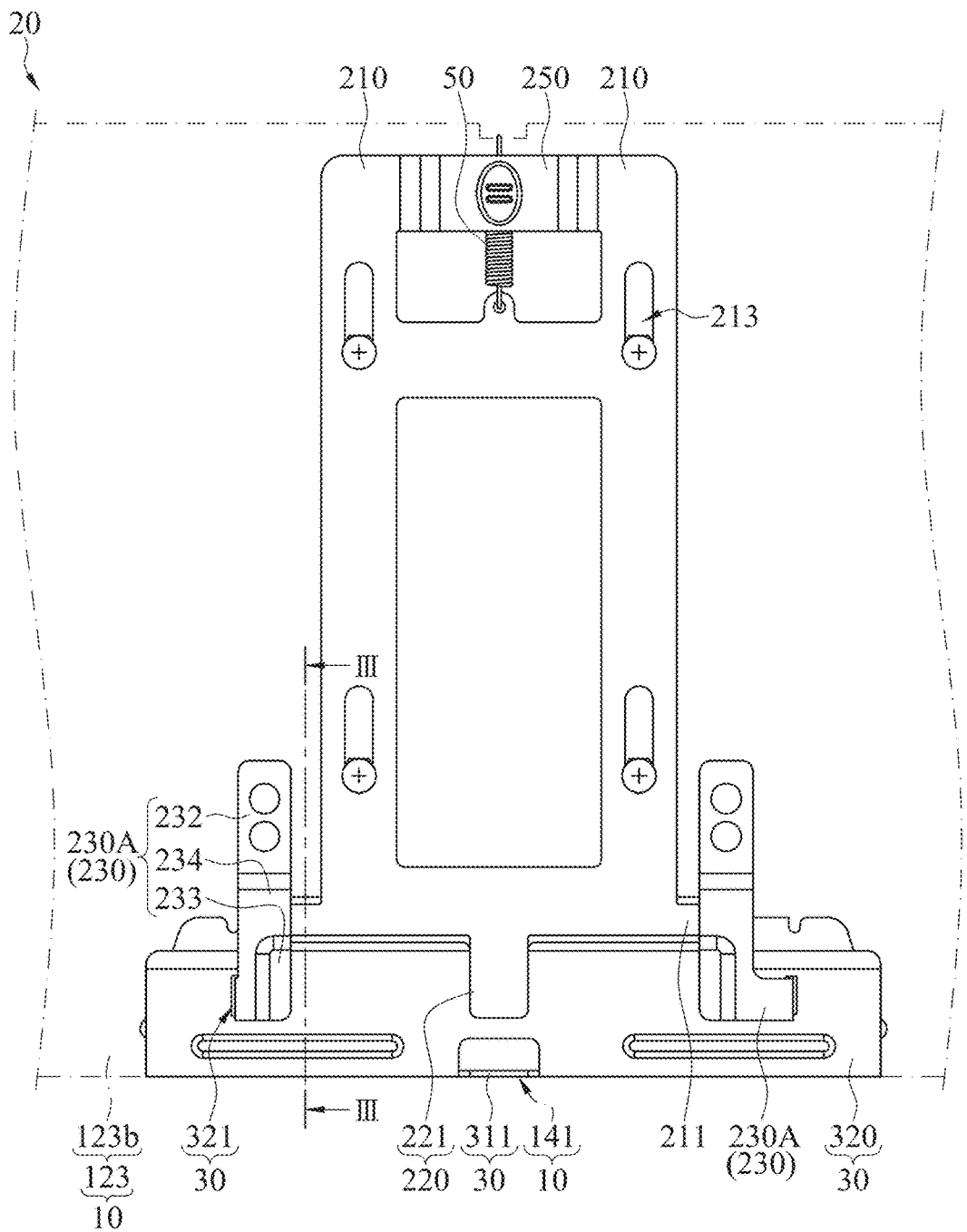
FIG. 14 is a top view of the disassembly and assembly structure in FIG. 13 in a first state.
Figure 15:
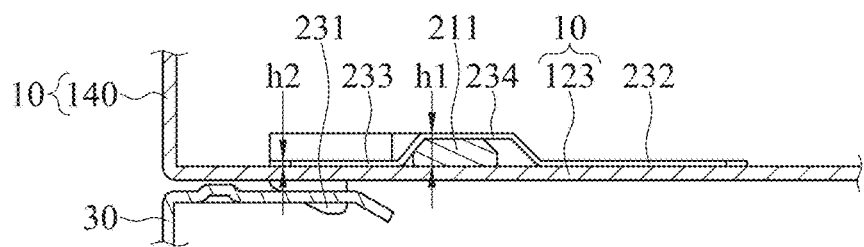
FIG. 15 is a cross-sectional view along a section line III-III in FIG. 14.

Referring to FIG. 13, FIG. 14, and FIG. 15, in the first state, the unbuckling member 210 is at a position (that is, the first position) away from the opening 110a of the corresponding receiving space 110, and the pushing member 220 is at a position (that is, the third position) away from the opening 110a of the corresponding receiving space 110. In this case, the pushing member 220 is completely located in the upper space of the housing 10, and the buckling member 230 passes through the board layer 123 to buckle with the dummy cover 30 located at the opening 110a of the receiving space 110.

When the unbuckling member 210 moves from the first position along the upper surface 123b of the board layer 123 to the second position (that is, moves toward the dummy cover 30), the pushing member 220 also moves from the third position along the upper surface 123b of the board layer 123 to the fourth position, so that the pushing member 220 pushes the dummy cover 30 out of the opening 110a of the receiving space 110 by pushing the stop tab 311 located in the notch 141 out of the notch 141. In other words, the disassembly and assembly structure 20 is changed from the first state to the second state.

Figure 16:
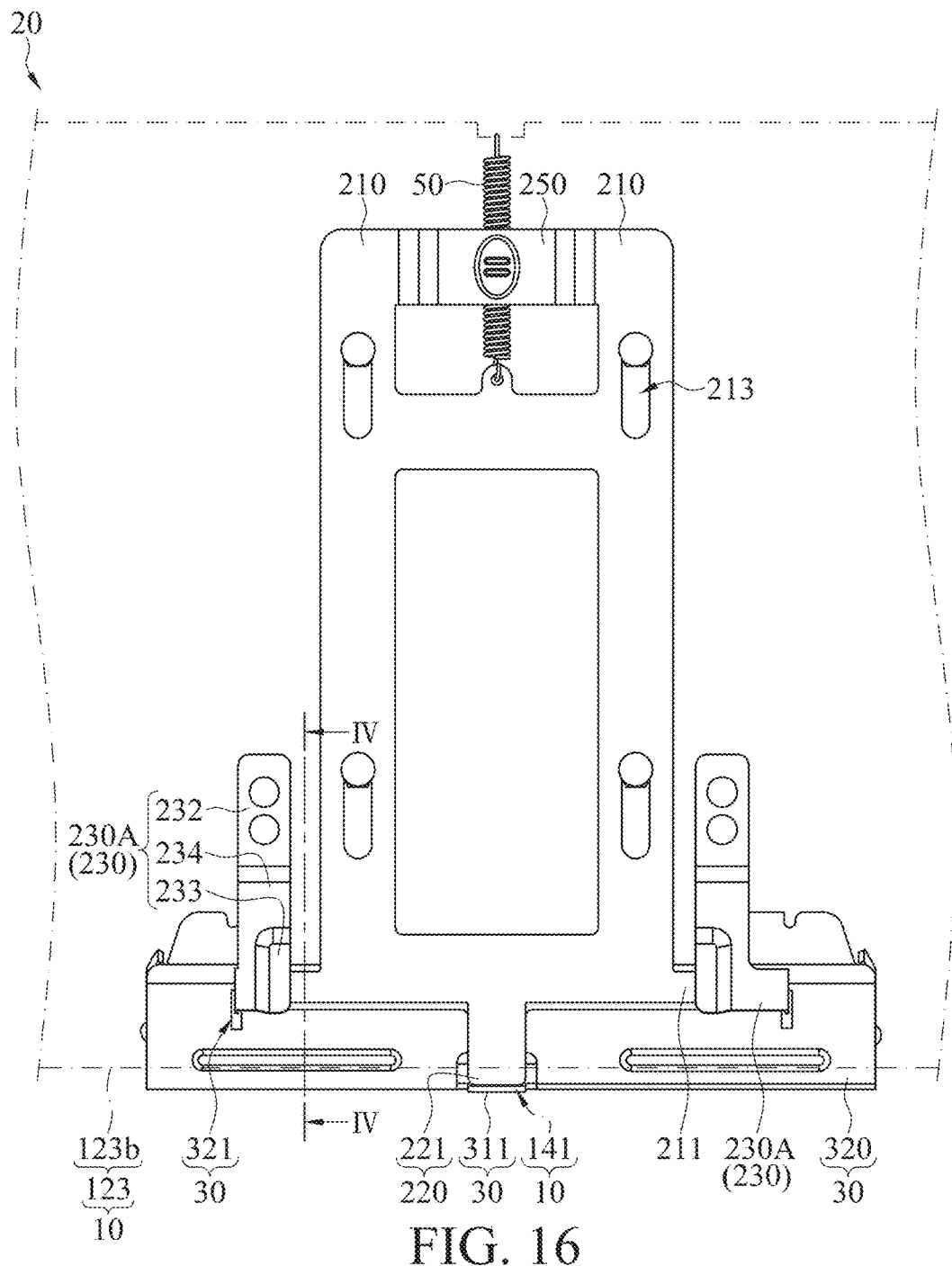
FIG. 16 is a top view of the disassembly and assembly structure in FIG. 13 in a second state.
Figure 17:
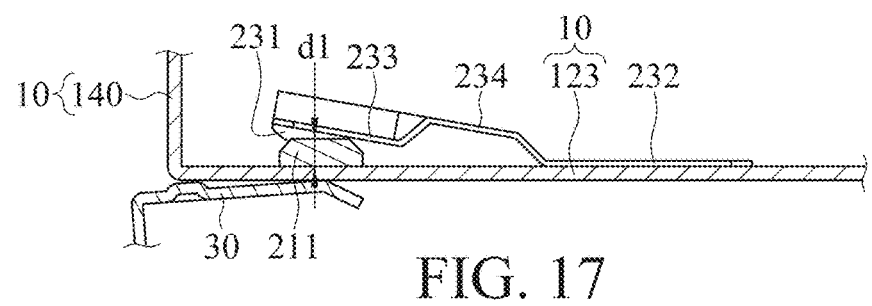
FIG. 17 is a cross-sectional view along a section line IV-IV in FIG. 16.

Referring to FIG. 13, FIG. 16, and FIG. 17, in the second state, the unbuckling member 210 is at a position (that is, the second position) adjacent to the opening 110a of the corresponding receiving space 110, and the pushing member 220 is at a position (that is, the fourth position) adjacent to the opening 110a of the corresponding receiving space 110. In this case, the buckling member 230 releases the dummy cover 30 under upward pushing by the unbuckling member 210, and the front end of the pushing member 220 protrudes into or passes through the notch 141 to push the dummy cover 30 out of the opening 110a of the corresponding receiving space 110.

For example, referring to FIG. 13, FIG. 14, and FIG. 16, relative to the first end of the buckling elastic sheet 230A, the second end 232 of the buckling elastic sheet 230A is fixed on the upper surface 123b of the board layer 123 away from the front side of the housing 10 (that is, away from the opening 110a of the corresponding receiving space 110). The first end of the buckling elastic sheet 230A has a hook 231. The section 234 having the second height h2 is located at the first end of the buckling elastic sheet 230A, that is, relative to the first height h1, the second height h2 is away from the second end 232 of the buckling elastic sheet 230A. The section 233 having the first height h1 is located between the second end 232 of the buckling elastic sheet 230A and the section 234, that is, relative to the second height h2, the first height h1 is adjacent to the second end 232 of the buckling elastic sheet 230A.

Referring to FIG. 14 and FIG. 15, in the first state, the unbuckling member 210 is at a position (that is, the first position) away from the opening 110a of the corresponding receiving space 110 relative to the second position thereof, the pushing tab 211 of the unbuckling member 210 is located below the section 233, and the pushing member 220 is at a position (that is, the third position) away from the opening 110a of the corresponding receiving space 110 relative to the fourth position thereof. In this case, the hook 231 passes through the opening 123a of the board layer 123 to be hooked on the buckling hole 321 of the dummy cover 30.

When the unbuckling member 210 moves toward the front side of the housing 10 (that is, moves toward the opening 110a of the corresponding receiving space 110) under an external force (that is, a force of pushing the unbuckling member 210 toward the front side of the housing 10), the pushing tab 211 of the unbuckling member 210 moves from the position below the section 233 to the position below the section 234. Moreover, when the unbuckling member 210 moves, the pushing member 220 coupled to a front end of the unbuckling member 210 is synchronously pushed to the front side of the housing 10, that is, gradually moved toward the opening 110a of the corresponding receiving space 110, so that the front end 221 of the pushing member 220 leans against the stop tab 311 of the dummy cover 30 located in the notch 141. Then the front end protrudes into or passes through the notch 141 against the stop tab 311 to push an upper half of the dummy cover 30 out of the opening 110a of the corresponding receiving space 110.

Referring to FIG. 16 and FIG. 17, in the second state, the unbuckling member 210 moves to a position (that is, the second position) adjacent to the opening 110a of the corresponding receiving space 110, the pushing tab 211 of the unbuckling member 210 moves to a position below the section 234, and the pushing member 220 also moves to a position (that is, the fourth position) adjacent to the opening 110a of the corresponding receiving space 110. In other words, at the fourth position, the pushing tab 211 of the unbuckling member 210 pushes the buckling elastic sheet 230A upward from a position below the section 234 so that the hook 231 leaves the buckling hole 321, and the front end 221 of the pushing member 220 protrudes into or passes through the notch 141 and pushes the upper half of the dummy cover 30 out of the opening 110a of the corresponding receiving space 110.

In some embodiments, the unbuckling member 210 and the pushing member 220 are an integrally formed disassembly and assembly rod.

In some embodiments, referring to FIG. 13, FIG. 14, and FIG. 16, in each disassembly and assembly structure set 20, a single pushing member 220 operates with two unbuckling members 210. A plurality of unbuckling members 210 may be connected to each other by using one or more connecting members 250 herein, to form an unbuckling rod for application of a force so that the plurality of unbuckling members 210 act in synchronization. In this case, the pushing member 220 is coupled to the front end of the unbuckling rod (that is, coupled to a side of the unbuckling rod adjacent to the opening 110a of the corresponding receiving space 110). Therefore, when the unbuckling rod moves under a force, the pushing member 220 is synchronously driven to move. Each of the unbuckling members 210 can operate with one buckling elastic sheet 230A according to the above arrangement principle of the buckling elastic sheet 230A (shown in FIG. 11 and FIG. 12) herein.

In some embodiments, the unbuckling rod (that is, the plurality of unbuckling members 210 and the one or more connecting members 250) may be integrally formed. In some embodiments, the unbuckling rod and the pushing member 220 may be an integrally formed disassembly and assembly rod.

Figure 18:
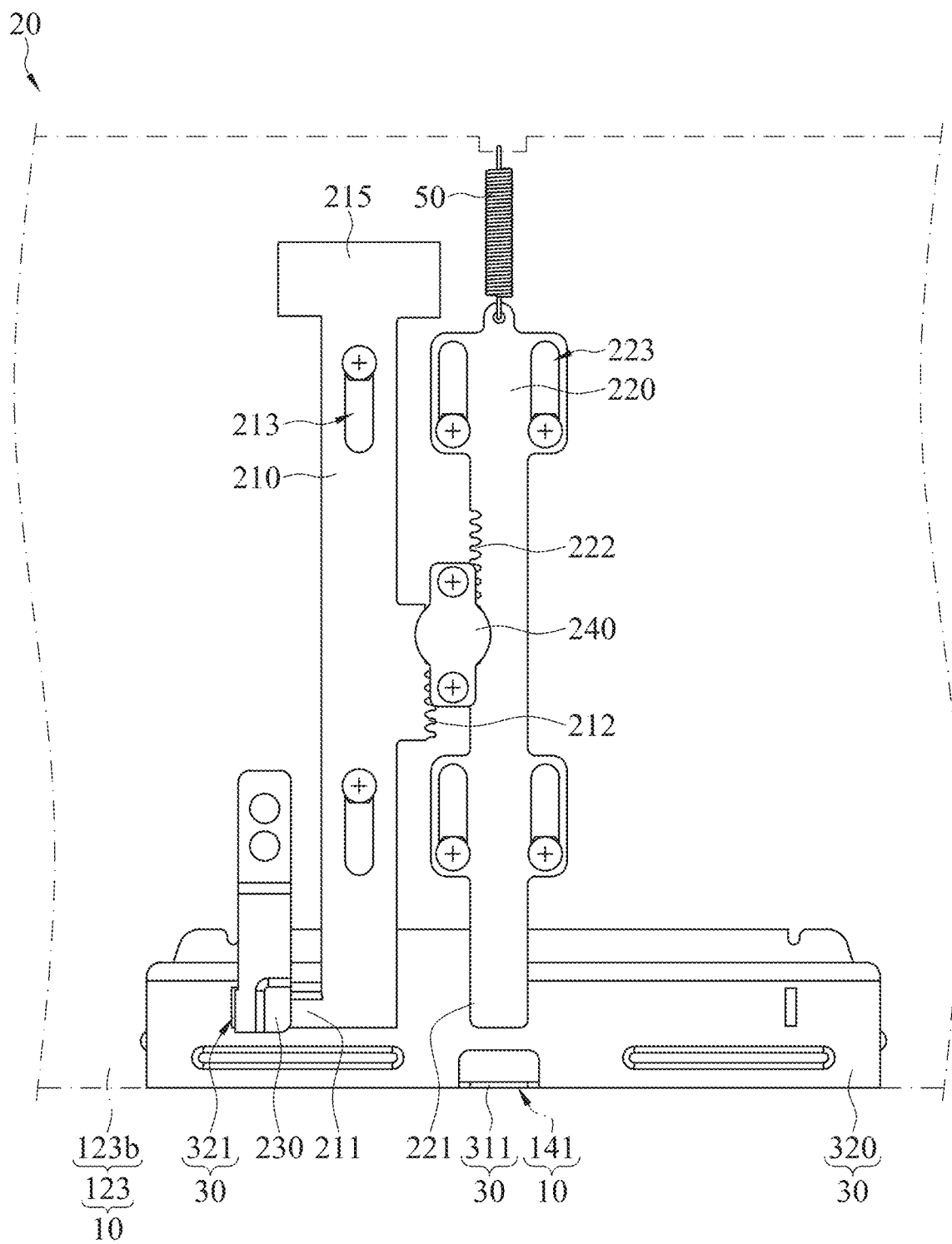
FIG. 18 is a top view of a fourth example of the disassembly and assembly structure.

In some embodiments, referring to FIG. 18, in each disassembly and assembly structure set 20, a single pushing member 220 operates with a single unbuckling member 210, and the unbuckling member 210 may operate with one buckling elastic sheet 230A according to the above arrangement principle of the buckling elastic sheet 230A.

In some embodiments, when each disassembly and assembly structure set 20 has a single unbuckling member 210, one end of the unbuckling member 210 may have a crossbar 215 to facilitate application of a force to the unbuckling member 210, which is shown in FIG. 18. In other words, maintenance personnel may apply a force to the unbuckling member 210 by grabbing the crossbar 215.

In some embodiments, referring to FIG. 3 to FIG. 18, the host casing 1 further includes: a resetting member 50. The resetting member 50 is coupled to the housing 10 and the disassembly and assembly structure 20. For example, one end of the resetting member 50 is coupled to the board layer 123, and the other end of the resetting member 50 is coupled to the pushing member 220 (which is shown in FIG. 3 to FIG. 12 and FIG. 18), the unbuckling member 210 (not shown), or a connecting member 250 (which is shown in FIG. 13 to FIG. 17).

Under an external force, the disassembly and assembly structure 20 is switched from the first state to the second state. When the external force is released, the resetting member 50 drives the disassembly and assembly structure 20 to restore to the first state from the second state.

In some embodiments, the resetting member 50 is a spring.

For example, the resetting member 50 is a spring. Referring to FIG. 5, FIG. 6, and FIG. 8, one end of the spring is hooked on the board layer 123, and the other end of the spring is hooked on the pushing member 220.

Referring to FIG. 6 and FIG. 7, in the first state, the spring is in a normal state, that is, a contracted state.

When the unbuckling member 210 gradually moves from the first position toward the rear side of the housing 10 to the second position under an external force, the pushing member 220 gradually moves from a position (that is, the third position) away from the opening 110*a* of the corresponding receiving space 110 toward the front side of the housing 10 in response to the movement of the unbuckling member 210, thereby gradually stretching the spring.

Referring to FIG. 8 and FIG. 9, in the second state, the pushing member 220 is at a position (that is, the fourth position) adjacent to the opening 110*a* of the corresponding receiving space 110. In this case, the external force applied to the unbuckling member 210 has not been released, and the spring is in a stretched state.

When the external force is released from the unbuckling member 210, the spring retracts to the contracted state due to a tensile elastic force, thereby pulling the pushing member 220 back to the third position, and the pushing member 220 reversely drives the unbuckling member 210 to cause the unbuckling member 210 to move back to the first position.

In another example, the resetting member 50 is a spring, and the plurality of unbuckling members 210, the plurality of connecting members 250, and the pushing member 220 are integrally formed disassembly and assembly rods. Referring to FIG. 13, FIG. 14, and FIG. 16, one end of the spring is hooked on the board layer 123, and the other end of the spring is hooked on the connecting member 250.

Referring to FIG. 14 and FIG. 15, in the first state, the spring is in a normal state, that is, a contracted state.

When the disassembly and assembly rod is under an external force to cause the unbuckling member 210 to gradually moves from the first position toward the front side of the housing 10 to the second position, the pushing member 220 gradually moves from a position (that is, the third position) away from the opening 110*a* of the corresponding receiving space 110 toward the front side of the housing 10 in response to the movement of the unbuckling member 210, and the disassembly and assembly rod gradually stretches the spring.

Referring to FIG. 16 and FIG. 17, in the second state, the pushing member 220 is at a position (that is, the fourth position) adjacent to the opening 110*a* of the corresponding receiving space 110. In this case, the external force applied to the disassembly and assembly rod has not been released, and the spring is in a stretched state.

When the external force is released from the unbuckling member 210, the spring retracts to the contracted state due to a tensile elastic force, and therefore the disassembly and assembly rod is pulled back, so that the unbuckling member 210 is pulled back to the first position and the pushing member 220 is pulled back to the third position.

In some embodiments, referring to FIG. 1, the top wall 121 of the housing 10 includes a fixed block 121*a* and a detachable block 121*b*. Edges of the fixed block 121*a* are fixed on the side walls 131 and 132. The top side of the housing 10 is defined by the fixed block 121*a* and the side walls 131 and 132 with an opening OP1, and the opening OP1 corresponds to a position of the disassembly and assembly structure 20. The detachable block 121*b* is detachably covered on the opening OP1. Therefore, when the dummy cover 30 is to be disassembled, the detachable block 121*b* may be removed from the opening OP1, and an external force may be applied to the disassembly and assembly structure 20 through the opening OP1 to release and push out the dummy cover 30.

In summary, in the application of the host casing 1 of the electronic device and the disassembly and assembly module of the dummy cover according to any embodiment, the dummy cover 30 can be quickly assembled and disassembled. When the dummy cover 30 is to be assembled at the opening 110*a* of the receiving space 110, the disassembly and assembly structure 20 can fix the dummy cover 30 at the opening 110*a* of the receiving space 110. When the dummy cover 30 is to be disassembled, the disassembly and assembly structure 20 can simultaneously release and push out the dummy cover 30. In this way, a replacement action between the dummy cover 30 and a pluggable device can be effectively simplified, so that maintenance personnel can easily assemble or disassemble the dummy cover 30 without assistance of additional tools. Furthermore, the disassembly and assembly structure 20 is disposed on the board layer 123, so that not only an overall size of the host casing 1 is not increased, but also a thermal dissipation effect and an appearance effect of the host casing 1 can be guaranteed.

What is claimed is:

1. A host casing of an electronic device, comprising:
   a housing, wherein a front side of the housing has an opening;
   a dummy cover disposed in the opening of the housing; and
   a disassembly and assembly structure disposed inside the housing, wherein the disassembly and assembly structure is configured to buckle with the dummy cover,
   wherein the housing comprises a board layer disposed inside the housing to partition inside of the housing into an upper layer and a lower layer, and the disassembly and assembly structure is located and movably fixed on an upper surface of the board layer;
   wherein the disassembly and assembly structure comprises:
      a buckling member located on the upper surface of the board layer, wherein one end of the buckling member movably passes through the board layer, and the buckling member is configured to pass through the board layer to buckle with the dummy cover;
      an unbuckling member movably disposed on the upper surface of the board layer; and a pushing member movably disposed on the upper surface of the board layer; and wherein the buckling member is further configured to release the dummy cover under pushing by the unbuckling member, and the pushing member is configured to push the dummy cover out of the opening under linkage of the unbuckling member.

2. The host casing of an electronic device according to claim 1, wherein the disassembly and assembly structure is further configured to release the dummy cover and simultaneously push the dummy cover out of the opening.

3. The host casing of an electronic device according to claim 1, wherein the buckling member is a buckling elastic sheet, wherein a first end of the buckling elastic sheet extends downward with a hook, and a second end of the buckling elastic sheet is fixed on the upper surface of the board layer, wherein the hook movably passes through the board layer and is configured to buckle with the dummy cover.

4. The host casing of an electronic device according to claim 3, wherein there is a first height and a second height between the buckling elastic sheet and the upper surface of the board layer, the first height is greater than the second height, the unbuckling member has a pushing tab, the pushing tab is located between the buckling elastic sheet and the board layer, and the pushing tab has a thickness greater than or less than the first height and greater than the second height.

5. The host casing of an electronic device according to claim 3, wherein the disassembly and assembly structure further comprises:

a linkage member, wherein the unbuckling member is configured to drive the pushing member through the linkage member.

6. The host casing of an electronic device according to claim 5, wherein the linkage member is a gear coupled between the unbuckling member and the pushing member, one side of the unbuckling member adjacent to the pushing member has a first rack engaged with the gear, and one side of the pushing member adjacent to the unbuckling member has a second rack engaged with the gear.

7. The host casing of an electronic device according to claim 5, wherein the linkage member is a conversion crossbar, the conversion crossbar is movably disposed on the unbuckling member and the pushing member, the conversion crossbar has two inclined surfaces, an upper surface of the unbuckling member has an inclined surface matching one of the two inclined surfaces of the conversion bar, and an upper surface of the pushing member has an inclined surface matching the other of the two inclined surfaces of the conversion bar, and wherein a relationship between the two inclined surfaces matching each other switches between being attached to each other and being staggered from each other, so as to drive the pushing member to move relative to the dummy cover.

8. The host casing of an electronic device according to claim 1, wherein the unbuckling member and the pushing member are integrally formed pull rods.

9. The host casing of an electronic device according to claim 1, further comprising:

a resetting member coupled to the housing and the disassembly and assembly structure, wherein the disassembly and assembly structure is configured to be switched from buckling with the dummy cover to being released from the dummy cover in response to an external force, and the resetting member is configured to drive the disassembly and assembly structure to reset because the external force is released.

10. A disassembly and assembly module of a dummy cover, comprising: a disassembly and assembly structure configured to simultaneously release the dummy cover from an opening of a housing and push the dummy cover out, wherein the disassembly and assembly structure comprises: a buckling member located on an upper surface of a board layer which disposed inside the housing to partition inside of the housing into an upper layer and a lower layer, and the disassembly and assembly structure is located and movably fixed on an upper surface of the board layer wherein one end of the buckling member movably passes through the board layer, and the buckling member is configured to pass through the board layer to buckle with the dummy cover; an unbuckling member movably disposed on the upper surface of the board layer; and a pushing member movably disposed on the upper surface of the board layer; and wherein the buckling member is further configured to release the dummy cover under pushing by the unbuckling member, and the pushing member is configured to push the dummy cover out of an opening under linkage of the unbuckling member.

11. The disassembly and assembly module of a dummy cover according to claim 10, wherein the disassembly and assembly structure is further configured to be buckled with the dummy cover.

12. The disassembly and assembly module of a dummy cover according to claim 10, wherein the buckling member is a buckling elastic sheet, a first end of the buckling elastic sheet extends downward with a hook, and the hook is configured to pass through a board layer to buckle with the dummy cover.

13. The disassembly and assembly module of a dummy cover according to claim 12, wherein there is a first height and a second height between an extension line of a lower surface of a second end of the buckling elastic sheet and a lower surface of a section of the buckling elastic sheet other than the second end, the first height is greater than the second height, the unbuckling member has a pushing tab, the pushing tab is located between the buckling elastic sheet and the dummy cover, and the pushing tab has a thickness greater than or less than the first height and greater than the second height.

14. The disassembly and assembly module of a dummy cover according to claim 10, wherein the disassembly and assembly structure further comprises:

a linkage member, wherein the unbuckling member is configured to drive the pushing member through the linkage member.

15. The disassembly and assembly module of a dummy cover according to claim 14, wherein the linkage member is a gear coupled between the unbuckling member and the pushing member, one side of the unbuckling member adjacent to the pushing member has a first rack engaged with the gear, and one side of the pushing member adjacent to the unbuckling member has a second rack engaged with the gear.

16. The disassembly and assembly module of a dummy cover according to claim 14, wherein the linkage member is a conversion crossbar, the conversion crossbar is movably disposed on the unbuckling member and the pushing member, the conversion crossbar has two inclined surfaces, an upper surface of the unbuckling member has an inclined surface matching one of the two inclined surfaces of the conversion bar, and an upper surface of the pushing member has an inclined surface matching the other of the two inclined surfaces of the conversion bar, and wherein a relationship between the two inclined surfaces matching each other switches between being attached to each other and being staggered from each other, so that the pushing member moves relative to the dummy cover due to linkage with the unbuckling member.

17. The disassembly and assembly module of a dummy cover according to claim 10, wherein the unbuckling member and the pushing member are integrally formed pull rods.

\* \* \* \* \*